US009553085B2

(12) United States Patent
Tse et al.

(10) Patent No.: US 9,553,085 B2
(45) Date of Patent: Jan. 24, 2017

(54) FABRICATING METHOD FOR HIGH VOLTAGE SEMICONDUCTOR POWER SWITCHING DEVICE

(71) Applicant: Mosway Semiconductor Limited, New Territories (HK)

(72) Inventors: Chiu-Sing Celement Tse, Yuen Long (HK); On-Bon Peter Chan, Shatin (HK); Chi-Keung Tang, New Territories (HK)

(73) Assignee: Mosway Semiconductor Limited, Tsuen Wan, New Territories, Hong Kong (CN)

( * ) Notice: Subject to any disclaimer, the term of this patent is extended or adjusted under 35 U.S.C. 154(b) by 0 days.

(21) Appl. No.: 14/949,021

(22) Filed: Nov. 23, 2015

(65) Prior Publication Data

US 2016/0079237 A1 Mar. 17, 2016

Related U.S. Application Data

(62) Division of application No. 14/064,843, filed on Oct. 28, 2013, now Pat. No. 9,245,880.

(51) Int. Cl.
*H01L 21/00* (2006.01)
*H01L 27/06* (2006.01)
(Continued)

(52) U.S. Cl.
CPC ......... *H01L 27/0635* (2013.01); *H01L 21/565* (2013.01); *H01L 21/8249* (2013.01); *H01L 21/84* (2013.01); *H01L 23/535* (2013.01); *H01L 27/0647* (2013.01); *H01L 27/0825* (2013.01); *H01L 27/1203* (2013.01);
(Continued)

(58) Field of Classification Search
CPC ........ H01L 27/06; H01L 21/56; H01L 29/739; H01L 29/872; H01L 27/082; H01L 29/45; H01L 23/535; H01L 29/08; H01L 29/10; H01L 29/417; H01L 29/423; H01L 29/06; H01L 29/49; H01L 21/8249; H01L 21/84; H01L 27/12
See application file for complete search history.

(56) References Cited

U.S. PATENT DOCUMENTS 4,164,747 A * 8/1979 Gerstner ................ H03K 17/14
257/570
4,456,920 A * 6/1984 Iesaka ................ H01L 27/0755
257/570
(Continued)

*Primary Examiner* — Caleb Henry
(74) *Attorney, Agent, or Firm* — Alix, Yale & Ristas, LLP

(57) ABSTRACT

A three terminal high voltage Darlington bipolar transistor power switching device includes two high voltage bipolar transistors, with collectors connected together serving as the collector terminal. The base of the first high voltage bipolar transistor serves as the base terminal. The emitter of the first high voltage bipolar transistor connects to the base of the second high voltage bipolar transistor (inner base), and the emitter of the second high voltage bipolar transistor serves as the emitter terminal. A diode has its anode connected to the inner base (emitter of the first high voltage bipolar transistor, or base of the second high voltage bipolar transistor), and its cathode connected to the base terminal. Similarly, a three terminal hybrid MOSFET/bipolar high voltage switching device can be formed by replacing the first high voltage bipolar transistor of the previous switching device by a high voltage MOSFET.

2 Claims, 19 Drawing Sheets

(51) Int. Cl.
  *H01L 21/56* (2006.01)
  *H01L 21/8249* (2006.01)
  *H01L 21/84* (2006.01)
  *H01L 23/535* (2006.01)
  *H01L 27/082* (2006.01)
  *H01L 27/12* (2006.01)
  *H01L 29/06* (2006.01)
  *H01L 29/08* (2006.01)
  *H01L 29/10* (2006.01)
  *H01L 29/417* (2006.01)
  *H01L 29/423* (2006.01)
  *H01L 29/45* (2006.01)
  *H01L 29/49* (2006.01)
  *H01L 29/872* (2006.01)

(52) U.S. Cl.
  CPC ...... *H01L 29/0634* (2013.01); *H01L 29/0804* (2013.01); *H01L 29/0821* (2013.01); *H01L 29/0847* (2013.01); *H01L 29/1004* (2013.01); *H01L 29/1095* (2013.01); *H01L 29/41708* (2013.01); *H01L 29/41758* (2013.01); *H01L 29/42304* (2013.01); *H01L 29/42356* (2013.01); *H01L 29/42364* (2013.01); *H01L 29/45* (2013.01); *H01L 29/4916* (2013.01); *H01L 29/872* (2013.01); *H01L 2224/48137* (2013.01); *H01L 2224/48247* (2013.01); *H01L 2224/49171* (2013.01); *H01L 2924/13055* (2013.01)

(56) References Cited

U.S. PATENT DOCUMENTS

| | | | | |
|---|---|---|---|---|
| 4,564,771 A * | 1/1986 | Flohrs | ............... | H01L 27/0825 257/570 |
| 4,652,902 A * | 3/1987 | Takata | ............... | H01L 23/4824 257/121 |
| 5,783,466 A * | 7/1998 | Takahashi | ............... | H01L 23/16 257/717 |
| 6,020,636 A * | 2/2000 | Adishian | ............... | H01L 23/49562 257/723 |
| 6,359,274 B1 * | 3/2002 | Nixon | ............... | B60R 1/088 250/214 C |
| 7,358,968 B2 * | 4/2008 | Sasada | ............... | G09G 3/294 257/197 |
| 7,372,109 B2 * | 5/2008 | Chen | ............... | H01L 27/0255 257/370 |
| 8,304,838 B1 * | 11/2012 | Chen | ............... | H01L 27/0255 257/355 |
| 8,581,339 B2 * | 11/2013 | Chang | ............... | H01L 29/404 257/139 |
| 2004/0084753 A1 * | 5/2004 | Fruth | ............... | G01K 7/01 257/565 |
| 2006/0157825 A1 * | 7/2006 | Umemoto | ............... | H01L 27/0259 257/567 |
| 2007/0070563 A1 * | 3/2007 | Ma | ............... | H01L 27/0255 361/56 |
| 2007/0241427 A1 * | 10/2007 | Mochizuki | ............... | H01L 21/101 257/586 |
| 2009/0057685 A1 * | 3/2009 | Mochizuki | ............... | H01L 29/0804 257/77 |
| 2010/0321840 A1 * | 12/2010 | Bobde | ............... | H01L 27/0266 361/56 |
| 2011/0012130 A1 * | 1/2011 | Zhang | ............... | H01L 29/1095 257/77 |
| 2012/0049831 A1 * | 3/2012 | Tse | ............... | H02M 3/33523 323/299 |
| 2012/0188007 A1 * | 7/2012 | Van Zyl | ............... | H01J 37/32183 327/574 |
| 2012/0256229 A1 * | 10/2012 | Chen | ............... | H01L 27/0262 257/139 |
| 2012/0286878 A1 * | 11/2012 | Dening | ............... | H01L 23/66 330/296 |
| 2012/0319768 A1 * | 12/2012 | Casey | ............... | H01L 27/0823 327/575 |
| 2013/0214824 A1 * | 8/2013 | Umetani | ............... | H03K 17/145 327/109 |
| 2013/0341729 A1 * | 12/2013 | Hisamoto | ............... | H01L 21/8249 257/378 |
| 2014/0146575 A1 * | 5/2014 | Tse | ............... | H02M 3/335 363/20 |
| 2015/0084117 A1 * | 3/2015 | Bobde | ............... | H01L 29/66734 257/328 |
| 2015/0115315 A1 * | 4/2015 | Tse | ............... | H01L 27/0647 257/140 |

* cited by examiner

FABRICATING METHOD FOR HIGH VOLTAGE SEMICONDUCTOR POWER SWITCHING DEVICE

CROSS-REFERENCE TO RELATED APPLICATION

This application is a divisional application of U.S. patent application Ser. No. 14/064,843 filed on Oct. 28, 2013.

BACKGROUND OF THE INVENTION

The present invention relates to high voltage semiconductor switching devices. The invention more particularly, although not exclusively, relates to switching device for switching converter applications.

Prior art switching converter circuits are shown in FIGS. 1 and 2. FIG. 1 shows an isolated constant voltage output switching converter while FIG. 2 shows a non-isolated switching converter having constant current output for driving LED lighting.

In both FIGS. 1 and 2, the selection of the power switching device (115 and 215 respectively) is a key decision. Bipolar transistor and MOSFET are typical candidates for power switching device. Bipolar transistors are much less costly than the MOSFET at the same power rating. However, MOSFETs are normally more preferred, especially at high power levels, due to the following reasons:

a. Bipolar transistors require continuous base current to keep them in the turn on state while MOSFETs only require the charge up of the gate capacitance to turn them on;

b. The current gain for power bipolar transistors with high breakdown voltage (say, 600V or more) is usually not high (say, at around 10 to 20, or even less than 10). This renders the power for driving the base substantial, especially when the power converter delivers high power to its output. The efficiency of the switching converter circuit will then be degraded.

By using bipolar transistors in a Darlington configuration, effective current gain becomes product of individual transistor current gain. Hence, effective current gain of a few hundred can be obtained easily and the power loss due to base driving can be reduced to comparable with the gate driving for MOSFET counterpart at the same power level. However, commercially available Darlington transistors are normally being offered in three pin package in which B is the first base and E is the last emitter as shown in FIG. 3. It is easy to turn on by a small base current but the turn off is very slow due to base relaxation at the inner base (base pin for transistors 302 and 304 in FIG. 3). Therefore, it is not suitable for switching converter application as slow switching transition generates substantial amount of heat at the switching device, as well as degradation of efficiency.

IGBT is a hybrid power switching device that attempts to combine the advantage of MOSFET and bipolar transistor. For IGBT, the power for the gate driving is small as it is the charge up of the control gate capacitance similar to the case of MOSFET while the chip size is similar to bipolar transistor for the same rated current due to the conduction mode is bipolar action. However, due to the actual bipolar base terminal is inside the device, it suffers the same problem of slow switching off as the three terminal Darlington bipolar transistor.

As of today, MOSFET is still the most widely used choice for power switching device.

SUMMARY

A high voltage three pin Darlington bipolar power switching device with fast turn off time is provided.

A high voltage hybrid MOSFET/bipolar power switching device with fast turn off time is also provided.

Each of these power switching devices can be fabricated as monolithic devices.

There is disclosed herein a three terminal high voltage Darlington bipolar transistor power switching device including the following components:

two high voltage bipolar transistors, with collectors connected together serving as the collector terminal for the power switching device, the base of the first high voltage bipolar transistor serving as the base terminal of the power switching device, the emitter of the first high voltage bipolar transistor connecting to the base of the second high voltage bipolar transistor (inner base), and the emitter of the second high voltage bipolar transistor serving as the emitter terminal of the power switching device; and a diode with its anode connected to the inner base (emitter of the first high voltage bipolar transistor, or base of the second high voltage bipolar transistor), and its cathode connected to the base terminal of the power switching device.

Preferably, the diode is a Schottky diode.

Alternatively, the diode can take the form of a diode connector bipolar transistor.

Preferably, all components are integrated as a monolithic IC using high voltage SOI process.

Preferably, all components are integrated as a monolithic IC using modified high voltage planer process.

There is further disclosed herein a method of fabricating a three terminal high voltage Darlington bipolar power switching including the steps of:

conductive die attaching two high voltage bipolar transistors having the substrate as collector terminal to the main die pad of a three pin power device package, which serves as the collector terminal for the power switching device;

conductive die attaching a diode with cathode as substrate to the base bonding pin of the base terminal of the three pin power device package;

bonding the base of the first high voltage bipolar transistor to the base terminal of the three pin power device package;

inter-chip bonding of the emitter of the first high voltage bipolar transistor to the base of the second high voltage bipolar transistor;

bonding of the emitter of the first high voltage bipolar transistor and/or the base of the second high voltage bipolar transistor to the anode of the diode;

bonding of the emitter of the second high voltage bipolar transistor to the emitter pin of the three pin power package; and subsequent standard moulding and follow on process to complete the device packaging.

The diode can be a Schottky diode.

There is further disclosed herein a method of fabricating a three terminal high voltage Darlington bipolar power switching device including the steps of:

conductive die attaching a single semiconductor chip high voltage Darlington bipolar transistor having four terminals—namely collector, first base, inner base, and emitter, with the substrate as the collector terminal, to the main die pad of a three pin power device package, which is also electrically connected to the collector terminal of the package;

conductive die attaching a diode with cathode as substrate to the base bonding pin of the base terminal of the three pin power device package;

bonding the first base of the high voltage Darlington bipolar transistor to the base terminal of the three pin power device package;

bonding the inner base of the high voltage Darlington bipolar transistor to the anode of the diode;

bonding the emitter of the high voltage Darlington bipolar transistor to the emitter pin of the three pin power package; and subsequent standard moulding and follow on process to complete the device packaging.

Again, the diode can be a Schottky diode.

There is further disclosed herein a monolithic three terminal high voltage Darlington bipolar power switching semiconductor integrated circuit including:

two high voltage bipolar transistors, with their substrates as a common collector and also serving as the collector terminal of the power switching integrated circuit at the back side;

two semiconductor well regions with the opposite dopant type to the substrate serving as the base regions for the high voltage bipolar transistors;

high doping density semiconductor electrodes of the same type as the substrate inside the base regions serving as emitters for the high voltage bipolar transistors; wherein:

the base of the first high voltage bipolar transistor serves as the base terminal of the power switching integrated circuit;

the emitter of the first high voltage bipolar transistor connects to the base of second high voltage bipolar transistor (inner base);

the emitter of the second high voltage bipolar transistor serves as the emitter terminal of the power switching integrated circuit; and a diode with its anode connected to the inner base and its cathode connected to the base terminal of the power switching integrated circuit; wherein the diode is a diode connected bipolar transistor with the following:

its collector as a well with opposite dopant type to the substrate on the substrate of the high voltage bipolar transistors;

a base inside the collector well with dopant type different from that of the collector well and interconnected to other components via electrodes;

an emitter, either as a semiconductor of the same type as the collector (for a normal diode), or as barrier metal silicide (for a Schottky diode); and the base and collector terminals being mutually connected and serving as the cathode while the emitter serves as the anode of the diode.

Preferably, the collector well for the diode connected bipolar shares the same mask for fabricating the wells for the base regions of the two high voltage bipolar transistors, or is a separate region fabricated by additional masking.

Preferably, the collector well of for the diode connected bipolar has high doping density regions guarding a low doping density region of the same type with a junction depth less than the high doping region, the high doping regions being used for withstanding the high breakdown voltage as well as connecting the low doping density collector well for making connection to other electrodes. The low doping density region is serving as the actual collector well inside which the base and emitter of the diode connected bipolar device are formed.

Preferably, the well for the collector of the diode connected bipolar transistor device is merged with the base of the first high voltage bipolar transistor (base pin of the three terminal high voltage Darlington bipolar power switching integrated circuit).

Preferably, connections to the base regions of the high voltage bipolar transistors forming the Darlington device and the collector region of the diode connected bipolar device using a normal base emitter junction are made via the same kind of semiconductor electrode for the anode of the diode.

Alternatively, the integrated circuit is monolithic and the diode connected bipolar has a Schottky base emitter junction and connections to the Schottky diode anode make direct contact thereto.

Preferably, connections to other semiconductor regions are made via barrier metal silicide for a monolithic power switching integrated circuit with a Schottky diode in the form of diode connected bipolar device.

There is further disclosed herein a three terminal high voltage hybrid MOSFET/bipolar transistor power switching device including the following:

a high voltage MOSFET and a high voltage bipolar transistor, with the channel terminals of the MOSFET connected to the collector and base terminals of the bipolar transistor respectively, the collector and emitter of the bipolar transistor serving as the collector and emitter terminals of the power switching device respectively, and the gate of the MOSFET serving as the gate terminal of the three terminal high voltage hybrid MOSFET/bipolar transistor power switching device; and a diode with the anode connected to the base of the high voltage bipolar transistor, and the cathode connected to the gate terminal of the power switching device.

The diode can be a Schottky diode.

The diode can (less preferably) take the form of a diode connector bipolar transistor.

Preferably, all components are fabricated on a monolithic IC using a high voltage SOI process.

Preferably, all components are fabricated as a monolithic IC using a planer, super-junction, or semi-super-junction high voltage process.

There is further disclosed herein a method of fabricating a three terminal high voltage hybrid MOSFET/bipolar power switching device, including the steps of:

conductive die attaching a high voltage MOSFET and a high voltage bipolar transistor having the substrate as drain and collector terminal respectively, to the main die pad of a three pin power device package, which serves as the collector terminal for the power switching device;

conductive die attaching a diode with cathode as substrate to the gate bonding pin of the gate terminal of the three pin power device package;

bonding the gate of the high voltage MOSFET to the gate terminal of the three pin power device package;

inter-chip bonding of the source of the high voltage MOSFET to the base of the high voltage bipolar transistor;

bonding of the source of the high voltage MOSFET and/or the base of the high voltage bipolar transistor to the anode of the diode;

bonding of the emitter of the high voltage bipolar transistor to the emitter pin of the three pin power package; and subsequent standard moulding and follow on process to complete the device packaging.

The diode can be a Schottky diode.

There is further disclosed herein a monolithic three terminal high voltage hybrid bipolar MOSFET/bipolar power switching semiconductor integrated circuit fabricated by high voltage planer process including:

a high voltage MOSFET and a high voltage bipolar transistor, with substrate as the drain and collector respectively such that the substrate serves as the collector terminal for the switching integrated circuit via high doping concentration region of the same type at the back side;

two semiconductor well regions with the opposite dopant type to the substrate serving as the body and base regions for the high voltage MOSFET and high voltage bipolar transistor respectively;

semiconductor electrodes of the same dopant type as the substrate with high doping density inside the body and base regions serving as source and emitter for the high voltage MOSFET and high voltage bipolar transistors respectively;

poly-silicon thin oxide gate electrodes overlapping the body and the substrate regions serving as the gate for the MOSFET; wherein:

the gate of the high voltage MOSFET serves as the gate terminal for the power switching integrated circuit;

the source terminal of the high voltage MOSFET connecting to the base of the high voltage bipolar transistor;

the body of the high voltage MOSFET connecting either to the source of the high voltage MOSFET, or as an alternative, to the emitter of the high voltage bipolar transistor;

the emitter of the high voltage bipolar transistor serving as the emitter terminal for the power switching integrated circuit; and a diode with the anode connected to the base of the high voltage bipolar transistor and the cathode connected to the gate terminal of the power switching integrated circuit; wherein:

the diode is a diode connected bipolar transistor with the following:

the collector with dopant type opposite to the main substrate as a well on the substrate of the high voltage bipolar transistor similar to the body of the high voltage MOSFET, or the base of the high voltage bipolar transistor;

a base inside the collector well with dopant type opposite from that of the collector well with interconnections to other parts via electrode similar to the emitter regions of the high voltage bipolar transistor, or the source of the high voltage MOSFET;

an emitter, either as semiconductor of the same type as the collector at much higher doping density (for a normal diode), or as barrier metal silicide (for Schottky diode); and the base and collector terminal are connected and serve as the cathode while the emitter serves as the anode of the diode.

Preferably, the collector well of for the diode connected bipolar shares the same mask for fabricating the wells for the body and base regions of the high voltage MOSFET and high voltage bipolar transistor, or as a separate region fabricated by additional masking.

Preferably, the collector well of for the diode connected bipolar has high doping density regions guarding a low doping density region of the same type with a junction depth less than the high doping region. The high doping regions are used for withstanding the high breakdown voltage as well as connecting the low doping density collector well for making connection, the low doping density region serving as the actual collector well inside which the base and emitter of the diode connected bipolar device are formed.

Preferably, the wells for the body of the high voltage MOSFET and the base of the high voltage bipolar transistor are merged for the case in which the body of the MOSFET is electrically connected to the base of the high voltage bipolar transistor.

Preferably, the diode is a Schottky diode and connections to semiconductor regions other than the Schottky diode anode are made via barrier metal silicide.

Preferably, connections to base region of the high voltage bipolar transistor and the body region of the high voltage MOSFET, and the collector region of the diode connected bipolar device using a normal base emitter junction are made via the same kind of semiconductor electrode for the anode of the diode.

There is further disclosed herein a monolithic three terminal high voltage hybrid bipolar MOSFET/bipolar power switching semiconductor integrated circuit fabricated by high voltage super-junction process including:

a high voltage MOSFET and a high voltage bipolar transistor, with substrate as the drain and collector respectively such that the substrate serves as the collector terminal for the power switching integrated circuit via high doping density region of the same type at the back side;

semiconductor well regions with the opposite dopant type to the substrate serving as the body and base regions for the high voltage MOSFET and high voltage bipolar transistor respectively, with high doping concentration super-junction columns of opposite type of dopant as the main substrate for withstanding the high breakdown voltage;

semiconductor electrodes of the same dopant type as the substrate with high doping density inside the body and base regions serving as source and emitter for the high voltage MOSFET and the high voltage bipolar transistor, respectively;

poly-silicon thin oxide gate electrodes overlapping the body and the substrate regions serving as the gate for the MOSFET; wherein:

the gate of the high voltage MOSFET serves as the gate terminal for the power switching integrated circuit;

the source terminal of the high voltage MOSFET connecting to the base of the high voltage bipolar transistor;

the body of the high voltage MOSFET connects to the source of the high voltage MOSFET, or as an alternative, to the emitter of the high voltage bipolar transistor;

the emitter of the high voltage bipolar transistor serves as the emitter terminal for the switching integrated circuit; and a diode with the anode connected to the base of the high voltage bipolar transistor and the cathode connected to the gate terminal of the power switching integrated device; wherein the diode is a diode connected bipolar transistor with the following:

the collector with dopant type opposite to the main substrate as a well on the substrate of the high voltage bipolar transistor similar to the body of the high voltage MOSFET, or the base of the high voltage bipolar transistor, with high doping concentration super-junction columns of opposite type of dopant of the substrate guarding the collector region for withstanding the high breakdown voltage;

a base inside the collector well with dopant type opposite from that of the collector well with interconnections to other parts via electrode similar to the emitter regions of the high voltage bipolar transistor, or the source of the high voltage MOSFET;

an emitter, either as semiconductor of the same type as the collector at much higher doping density (for a normal diode), or as a barrier metal silicide (for a Schottky diode); and the base and collector terminal are connected and serves as the cathode while the emitter serves as the anode of the diode.

Preferably, the collector well for the diode connected bipolar shares the same mask for fabricating the wells for the body and base regions of the high voltage MOSFET and high voltage bipolar transistor, or as a separate region fabricated by additional masking.

Preferably, the collector well for the diode connected bipolar has high doping density regions guarding a low doping density region of the same type with a junction depth less than the high doping region. The high doping regions are used for withstanding the high breakdown voltage as well as connecting the low doping density collector well for making connection. The low doping density region is serving as the actual collector well inside which the base and emitter of the diode connected bipolar device are formed.

Preferably, the wells for the body of the high voltage MOSFET and the base of the high voltage bipolar transistor are merged for the case in which the body of the high voltage MOSFET is electrically connected to the base of the high voltage bipolar transistor. In addition, isolation region super-junction columns between the high voltage MOSFET and the high voltage bipolar transistor can also be merged, with the isolation region eliminated.

The diode can be a Schottky diode and connections to semiconductor regions other than the Schottky diode anode are made via barrier metal silicide.

Preferably, connections to base region of the high voltage bipolar transistor and the body region of the high voltage MOSFET, and the collector region of the diode connected bipolar device using normal base emitter junction are made via the same kind of semiconductor electrode for the anode of the diode.

There is further disclosed herein a monolithic three terminal high voltage hybrid bipolar MOSFET/bipolar power switching semiconductor integrated circuit fabricated by high voltage semi-super-junction process comprising:

a high voltage MOSFET and a high voltage bipolar transistor, with substrate as the drain and collector respectively such that the substrate serves as the collector terminal for the power switching integrated circuit via high doping density region of the same type at the back side;

semiconductor well regions with the opposite dopant type to the substrate serving as the body and base regions for the high voltage MOSFET and high voltage bipolar transistor respectively, with high doping concentration semi-super-junction columns of opposite type of dopant as the main substrate for withstanding the high breakdown voltage;

semiconductor electrodes of the same dopant type as the substrate with high doping density inside the body and base regions serving as source and emitter for the high voltage MOSFET and the high voltage bipolar transistor, respectively;

poly-silicon thin oxide gate electrodes overlapping the body and the substrate regions serving as the gate for the MOSFET; wherein:

the gate of the high voltage MOSFET serves as the gate terminal for the power switching integrated circuit;

the source terminal of the high voltage MOSFET connecting to the base of the high voltage bipolar transistor;

the body of the high voltage MOSFET connects to the source of the high voltage MOSFET, or as an alternative, to the emitter of the high voltage bipolar transistor;

the emitter of the high voltage bipolar transistor serving as the emitter terminal for the power switching integrated circuit; and a diode with the anode connected to the base of the high voltage bipolar transistor and the cathode connected to the gate terminal of the power switching integrated circuit; wherein the diode is a diode connected bipolar transistor with the following:

the collector with dopant type opposite to the main substrate as a well on the substrate of the high voltage bipolar transistor similar to the body of the high voltage MOSFET, or the base of the high voltage bipolar transistor, with high doping concentration semi-super-junction columns of opposite type of dopant of the substrate guarding the collector region for withstanding the high breakdown voltage;

a base inside the collector well with dopant type opposite from that of the collector well with interconnections to other parts via electrode similar to the emitter regions of the high voltage bipolar transistor, or the source of the high voltage MOSFET;

an emitter, either as semiconductor of the same type as the collector at much higher doping density (for normal diode), or as barrier metal silicide (for Schottky diode); and the base and collector terminal are connected and serving as the cathode while the emitter is serving as the anode of the diode.

Preferably, the collector well of for the diode connected bipolar shares the same mask for fabricating the wells for the body and base regions of the high voltage MOSFET and high voltage bipolar transistor, or as a separate region fabricated by additional masking.

Preferably, the collector well of for the diode connected bipolar has high doping density regions guarding a low doping density region of the same type with a junction depth less than the high doping region. The high doping regions are used for withstanding the high breakdown voltage as well as connecting the low doping density collector well for making connection. The low doping density region serves as the actual collector well inside which the base and emitter of the diode connected bipolar device are formed.

Preferably, the wells for the body of the high voltage MOSFET and the base of the high voltage bipolar transistor are merged for the case in which the body of the high voltage MOSFET is electrically connected to the base of the high voltage bipolar transistor. In addition, semi-super-junction columns between the high voltage MOSFET and the high voltage bipolar transistor can also be merged, with the isolation region between them eliminated.

Preferably, the diode is a Schottky diode and connections to semiconductor regions other than the Schottky diode anode are made via barrier metal silicide.

Preferably, connections to the base region of the high voltage bipolar transistor and the body region of the high voltage MOSFET, and the collector region of the diode connected bipolar device using normal base emitter junction are made via the same kind of semiconductor electrode for the anode of the diode.

BRIEF DESCRIPTION OF THE DRAWINGS

Preferred forms of the present invention will now be described by way of example with reference to the accompanying drawings, wherein.

DETAILED DESCRIPTION

Figure 1:
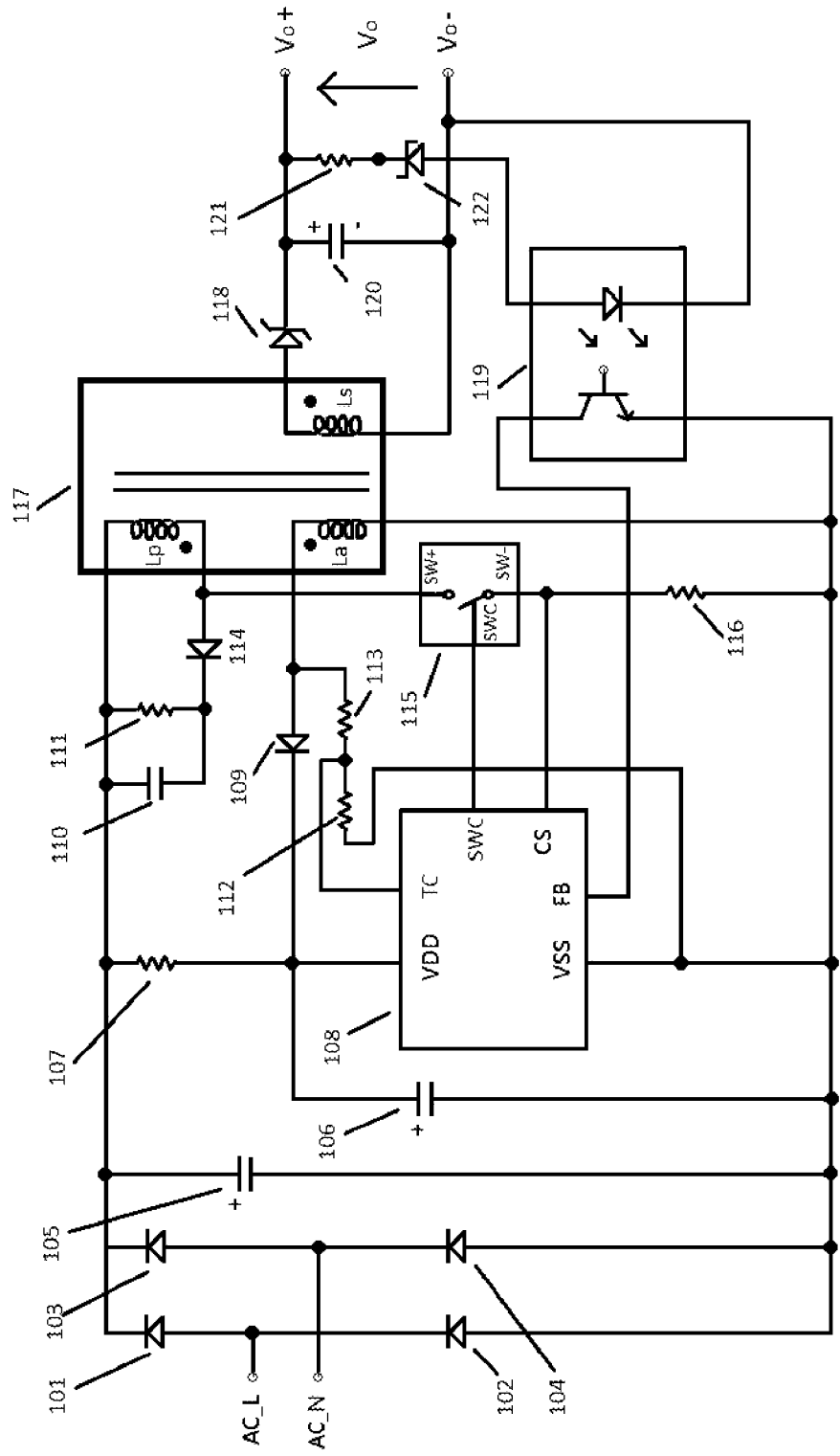
FIG. 1 shows a typical prior art switching converter with isolated constant voltage output.
Figure 2:
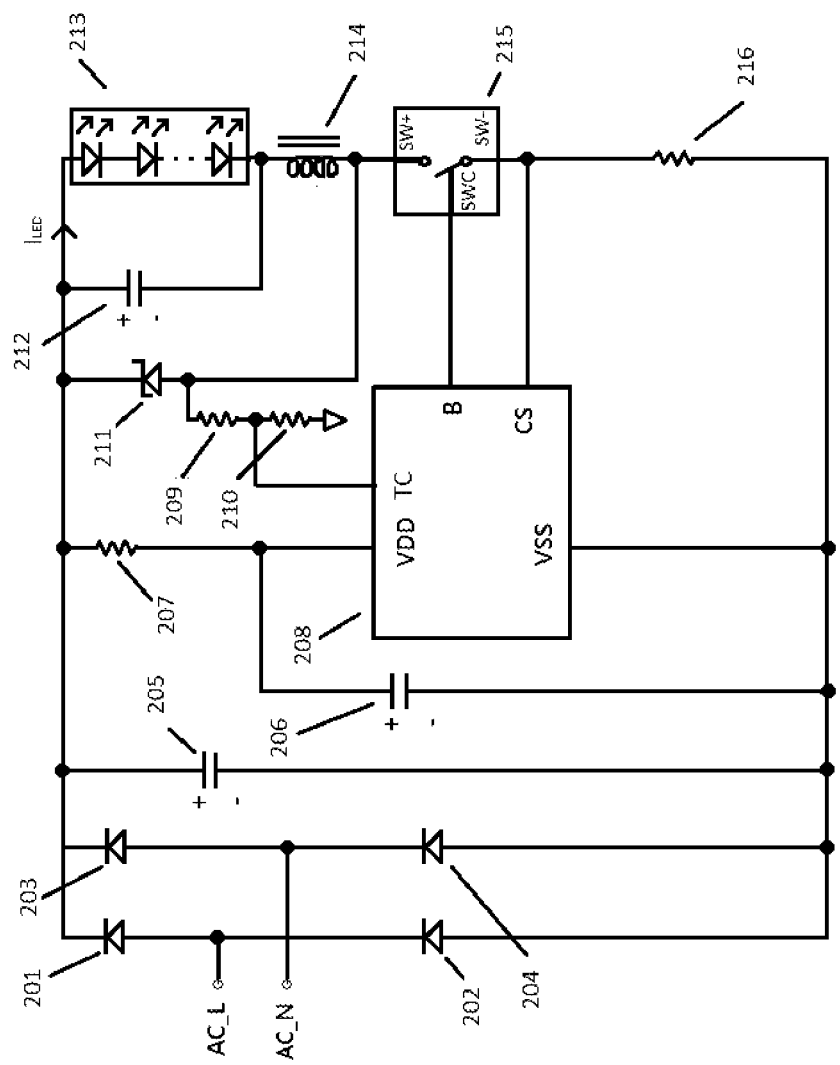
FIG. 2 shows a typical prior art switching converter with non-isolated constant current output for LED lighting application.
Figure 3:
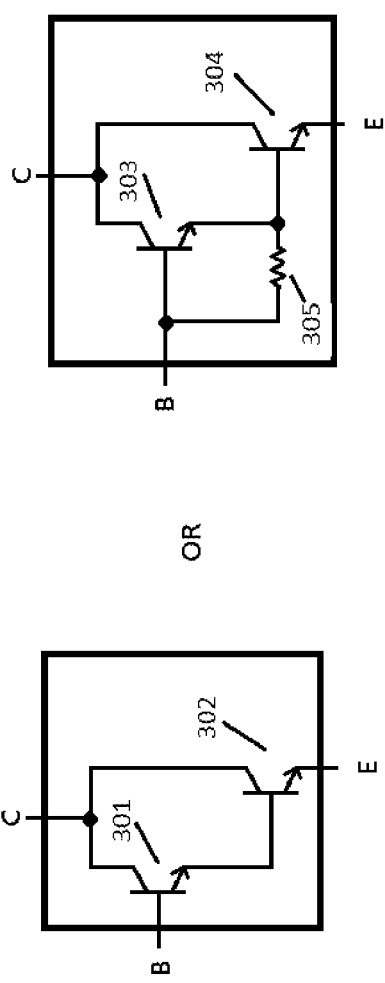
FIG. 3 illustrates two typical prior art circuit schematic for Darlington transistor with three pin package.
Figure 4:
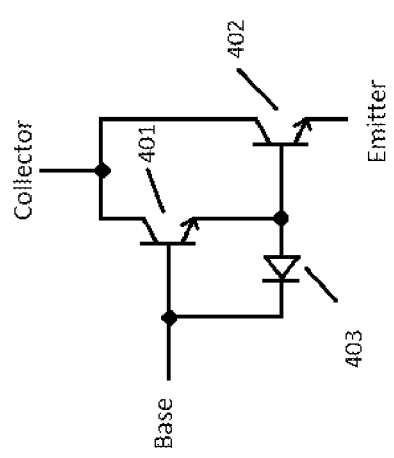
FIG. 4 is a schematic circuit diagram for the invented three pin high voltage Darlington bipolar power switching device with fast turn off time.

FIG. 4 is a schematic circuit diagram for an embodiment of the invented three pin high voltage Darlington bipolar power switching device with fast turn off time. High voltage bipolar transistors 401 and 402 form a conventional Darlington bipolar transistor. The current gain of the Darlington transistor is the product of the individual current gain of transistor 401 and transistor 402. Typical current gain of 100 to 400 can be achieved. Therefore, base current to turn on the Darlington transistor is small and the associated power is comparable to the gate drive for power MOSFET power switching device for handling the same output power level. The addition of the diode 403 is to provide a discharging path for the base of transistor 402 during switch off of the Darlington transistor. Hence, diode 403 ensures fast base relaxation and thus fast turn off of this invented power switching device. For diode 403, Schottky diode is more preferred due to the low forward voltage as compared with the forward voltage of the base emitter junction of transistor 402. This enables the direct connecting of the emitter terminal of the switching device to Vss. A normal diode can still work due to the emitter voltage in typical applications is higher than the Vss voltage as in the cases of FIG. 1 and FIG. 2. Hence, this invented power switching device can be used with the collector and emitter terminals as the positive and negative sides of the power switching device while the base terminal as the control terminal in FIG. 1 and FIG. 2.

Figure 5:
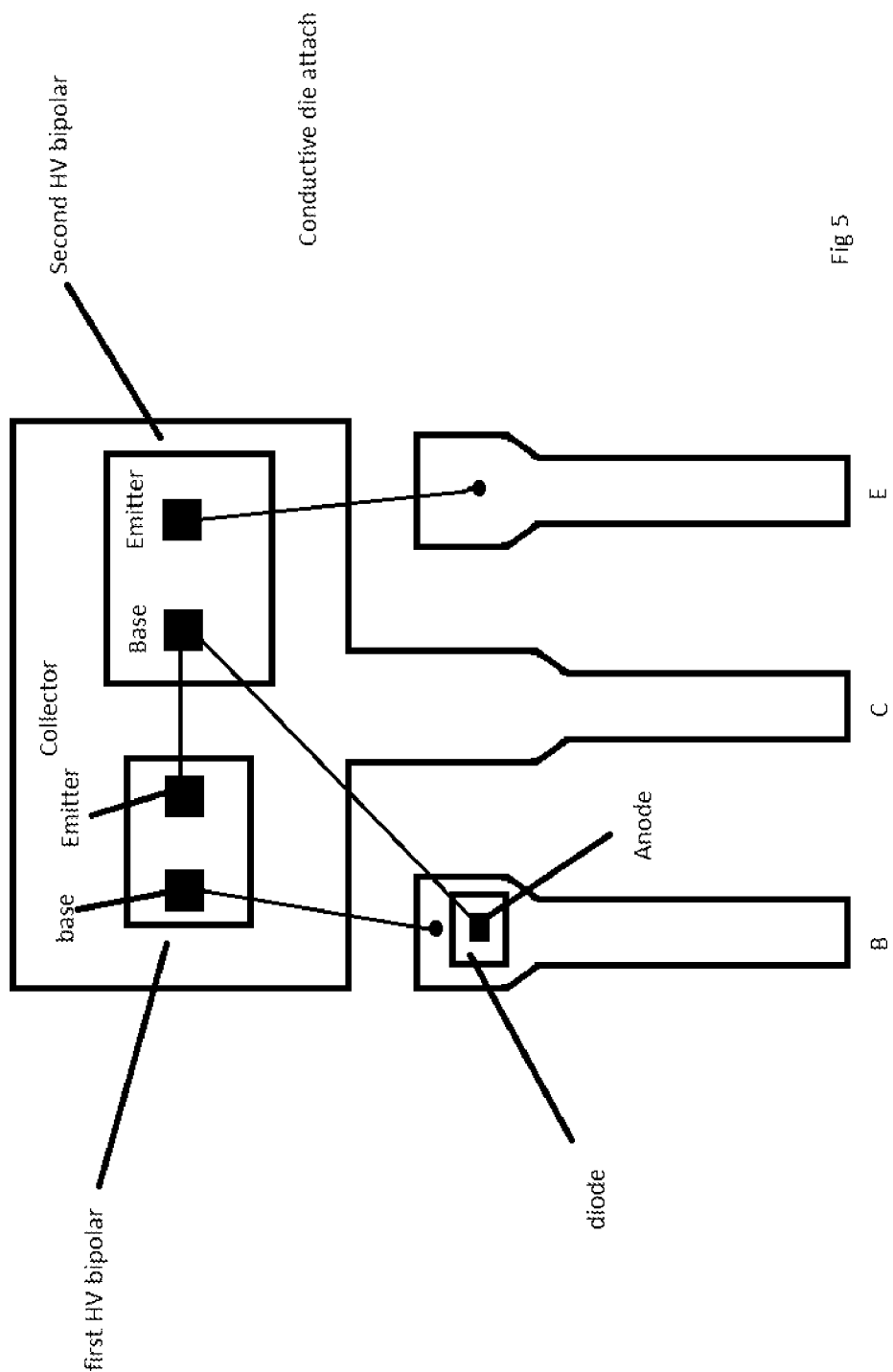
FIG. 5 illustrates a possible bonding diagram to integrate discrete devices forming the invented high voltage Darlington bipolar power switching device into a single three pin package.

The three discrete semiconductor chips forming the invented high voltage Darlington bipolar power switching devices can be packaged into a single three pin IC. Bipolar transistors used are having the backside substrate as the collector terminal while the base and emitter terminals are at the front side with bonding pads. Diode having cathode as substrate and anode pad at front side is used. The two bipolar transistors are die attached to the main die pad using conductive die attach epoxy. The main die pad and the collector pin of the package are electrically connected. The diode is conductive die attached to the base pin. Appropriate bonding connects the three individual discrete semiconductor chips into the circuit as shown in FIG. 4. Further steps such as plastic moulding, etc., to complete the packaging are then carried out to complete the three pin packaging. FIG. 5 is a bonding diagram for inter-connecting the discrete devices into a single three pin package.

Figure 6:
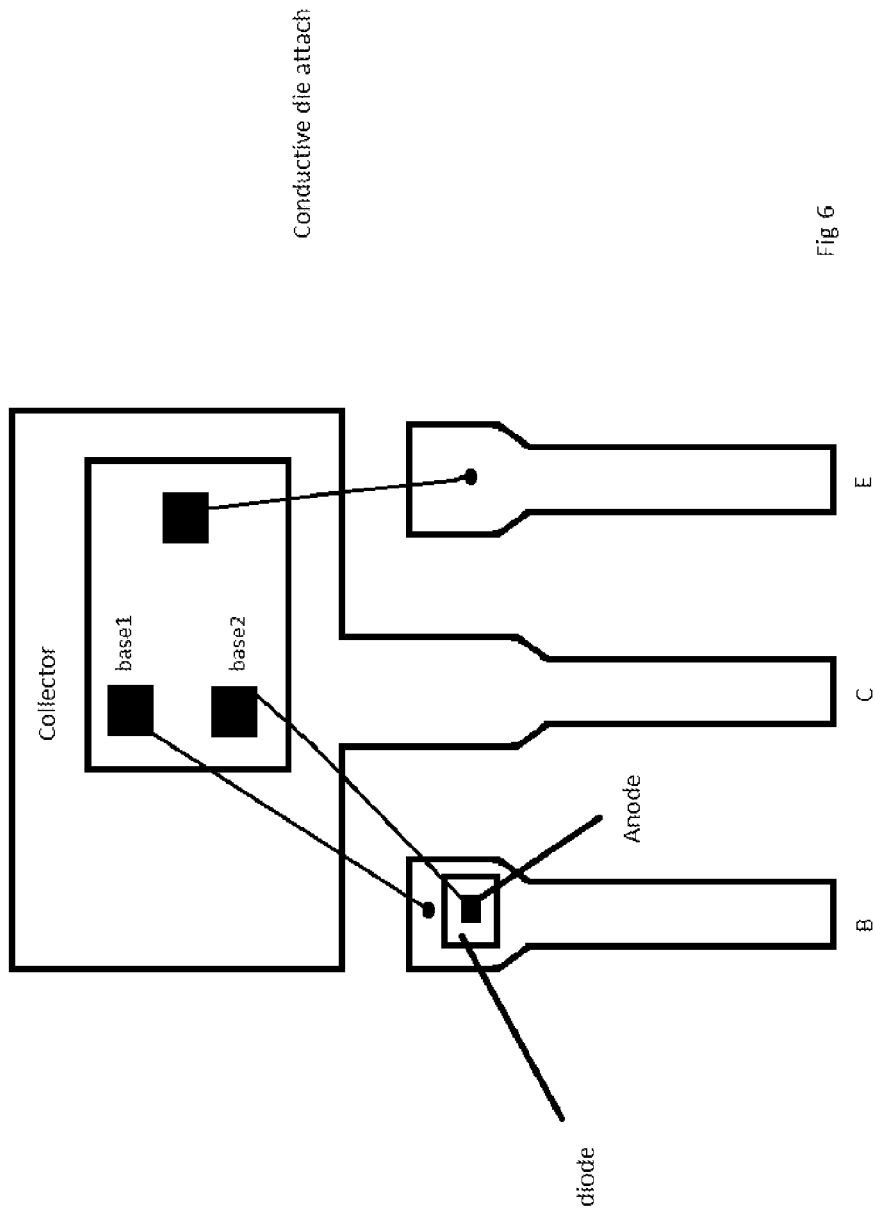
FIG. 6 illustrates another possible bonding diagram to integrate discrete devices forming the invented high voltage Darlington bipolar power switching device into a single three pin package.

It should be noted that if high voltage Darlington bipolar transistor chip with four bonding pads, namely collector, emitter, first and inner base pads, are available, the two bipolar chips in FIG. 5 can be reduced to a single chip and the inter-chip bonding wire between the first emitter and the second base can be eliminated. The new bonding diagram for this particular embodiment is illustrated in FIG. 6.

The three discrete devices forming the invented high voltage Darlington bipolar power switching device can be fabricated as a monolithic integrated circuit (IC). Use of high voltage SOI process is an obvious embodiment. Other possible embodiments are discussed in subsequent paragraphs.

The major difficulty in integrating the three discrete devices forming the invented high voltage Darlington power switching device into a monolithic IC using high voltage planer process is the isolation of the diode from the substrate. A simple diode using a base well as anode and the emitter electrode inside the base well as cathode will not work due to the turn on of the parasitic vertical bipolar transistor having the substrate acting as the collector in the same way as for the transistors forming the high voltage Darlington transistor. A diode connected bipolar is used to provide means to avoid the turn on of the parasitic transistor in the diode region.

Figure 7:
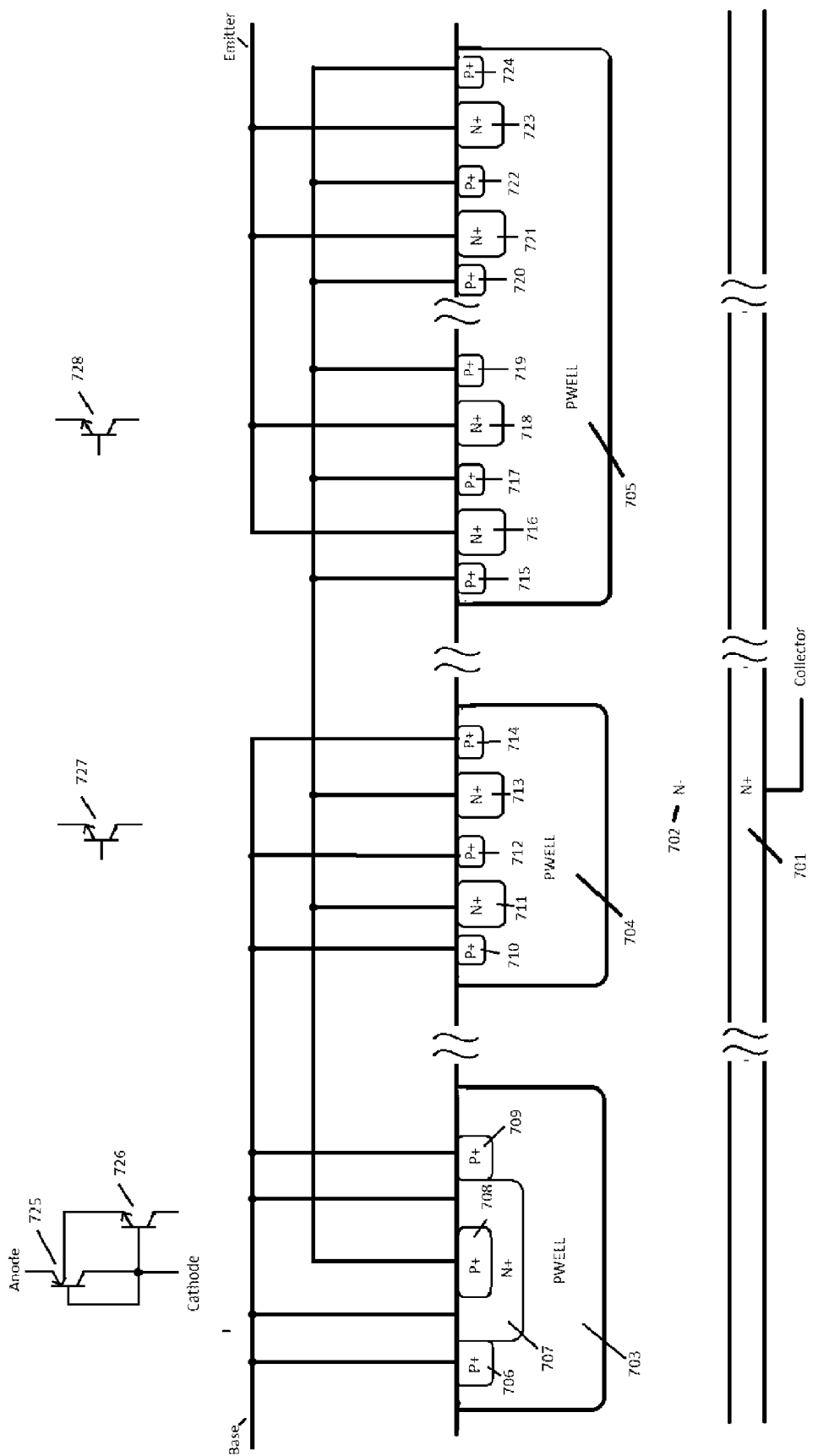
FIG. 7 illustrates a possible cross section of the invented high voltage Darlington bipolar switching device as a monolithic IC.

FIG. 7 is a cross section of a possible embodiment of such an integrated circuit. In FIG. 7, N+ region 701 at the back side is used for conductive die attach to the die pad which is also electrically serving as the collector pin, the N− region 702 is the actual collector region that can withstand high breakdown voltage. P well 703 is the collector of a diode connected PNP transistor (725) inside which the N+ regions 707 serves as the base, while the P+ region 708 is the emitter. The emitter 708 serves as the anode while base formed by N+ region 707 together with P well collector 703 serve as the cathode of the diode connected PNP transistor 725. The use of diode connected PNP transistor instead of a simple diode using the P well 703 as anode and N+707 as cathode is required due to the vertical NPN transistor 726 formed by N− region 702 as collector, P well region 703 as base, and N+ regions 707 as the emitter region, will become on during the time when current flows from the P well anode 703 to the N+ cathode 707. This diode connected PNP transistor structure ensures that the vertical NPN transistor 726 will never be on due to the P well 703 serving as base is always at the same potential as the N+ emitter region 707 inside it. Furthermore, transistor current gain makes this device smaller as compared with simple diode for handling the same forward diode current. The P well region of this diode connected device 725 may share the same masking, having the same dosage and drive in conditions as other P wells (704 and 705) serving as base regions for the 2 bipolar transistors forming the Darlington transistor, or may have another independent P well having another masking step, dosage and drive in conditions provided that it can together with the collector N− layer 702 to withstand the required high reverse breakdown voltage. P wells 704 and 705 are the base regions for the first and inner bipolar transistors (727 and 728) forming the Darlington transistor respectively. N+ regions 711 and 713 are the emitters for the first bipolar transistor for the Darlington transistor while N+ regions 716, 718, 721, and 723 are the emitters for the inner bipolar transistor of the Darlington transistor. All such N+ emitters may and prefer to share the same masking, and have the same dosage as the N+ region 707 (cathode of the diode connected PNP described previously). The dopant density of P wells 703, 704 and 705 are usually high enough for making direct ohmic contact with metal. Since an extra masking step is required for making the P+ junction 708, this provides an option to share the same mask to make P+ contacts for metal layer to connect to these three P well regions. Since P well 703 and P well 704 are at the same potential (electrically connected), it is preferred to merge these two P wells into a single P well in order to reduce the chip size.

Figure 8:
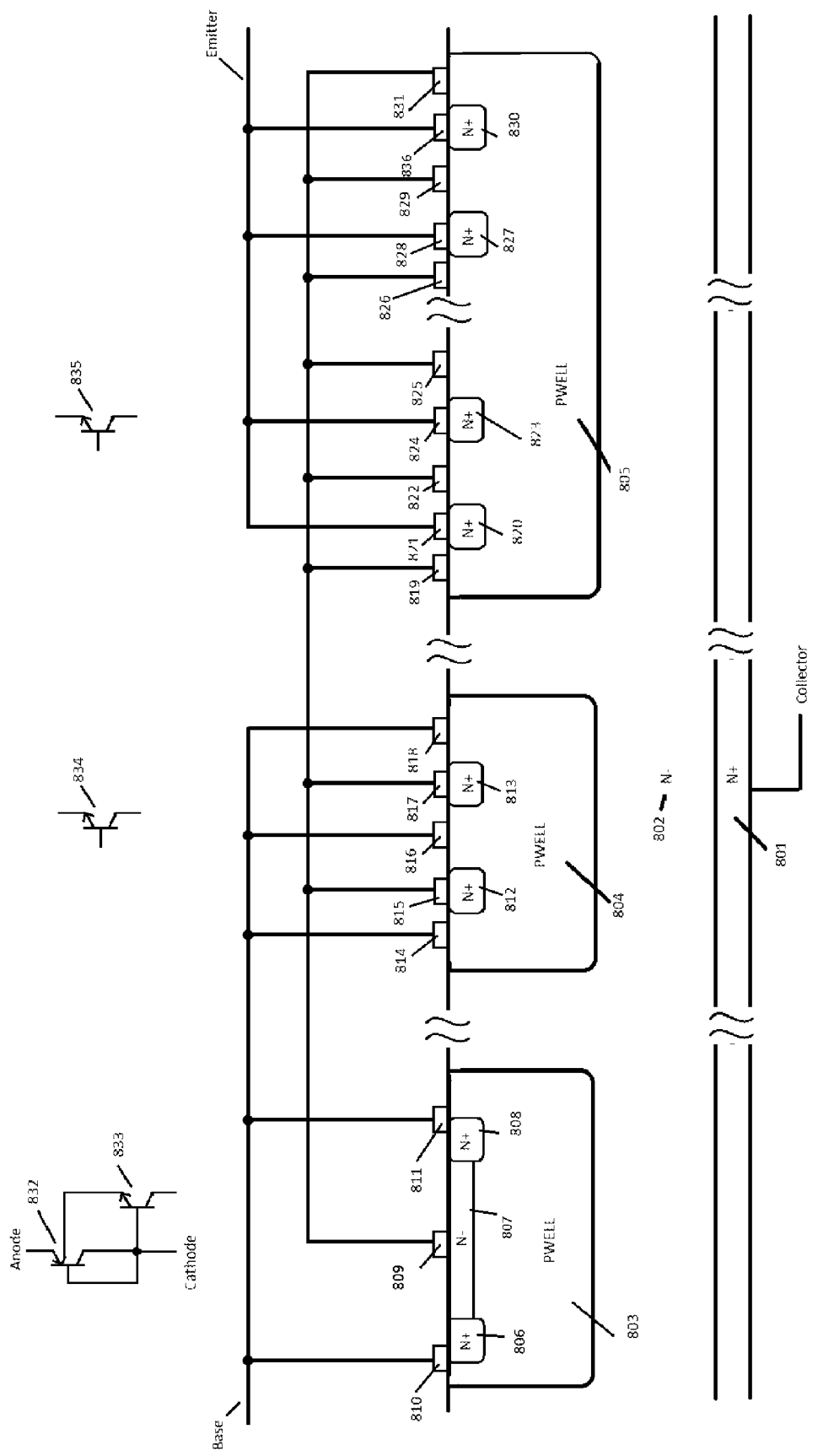
FIG. 8 illustrates another possible cross section of the invented high voltage Darlington bipolar switching device as a monolithic IC.

FIG. 8 depicts another embodiment in which devices 832, 833, 834 and 835 correspond to devices 725, 726, 727, and 728 respectively in FIG. 7. The major difference between FIG. 7 and FIG. 8 is the implementation of the diode connected bipolar transistor. The diode connected bipolar transistor 832 in FIG. 8 has a Schottky base emitter junction while the corresponding device 725 in FIG. 7 is having a normal base emitter junction. An additional masking step is required to create the N− junction inside P well 803, which can have a deeper or shallower junction depth as compared with the N+ junctions. Interconnecting metal contact via the barrier metal silicide 809 for connecting to the N− region inside the P well 803 is used to form the Schottky junction. It is optional for the interconnecting metal to make contact to other semiconductor regions direct, or via the barrier metal silicide (810, 811, 814, 815, 816, 817, 818, 819, 821, 822, 824, 825, 826, 828, 829, 831 and 836). Making connection for other regions via barrier metal silicide has the possibility to save 1 masking step. Since P well 803 and P well 804 are at the same potential (electrically connected), it is preferred to merge these two P wells into a single P well in order to reduce the chip size.

Figure 9:
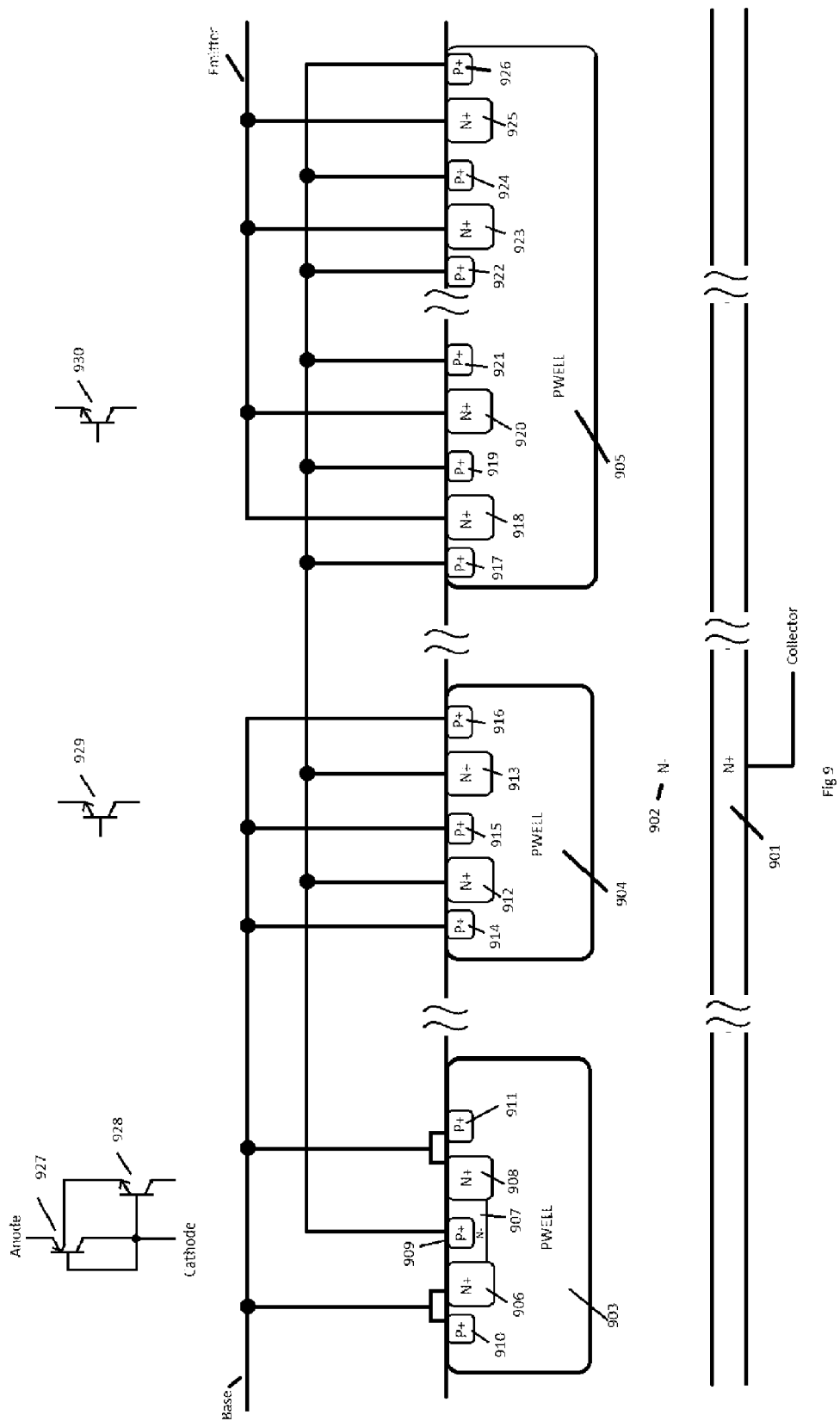
FIG. 9 illustrates a third possible cross section of the invented high voltage Darlington bipolar switching device as a monolithic IC.

Another embodiment is to change the diode connected transistor's base emitter junction in FIG. 8 to a bulk silicon P+ junction. The actual equivalent circuit is the same as for FIG. 7. Cross section of such a monolithic device is illustrated in FIG. 9. Options applicable to FIG. 7 are applicable to FIG. 9 in general.

Figure 10:
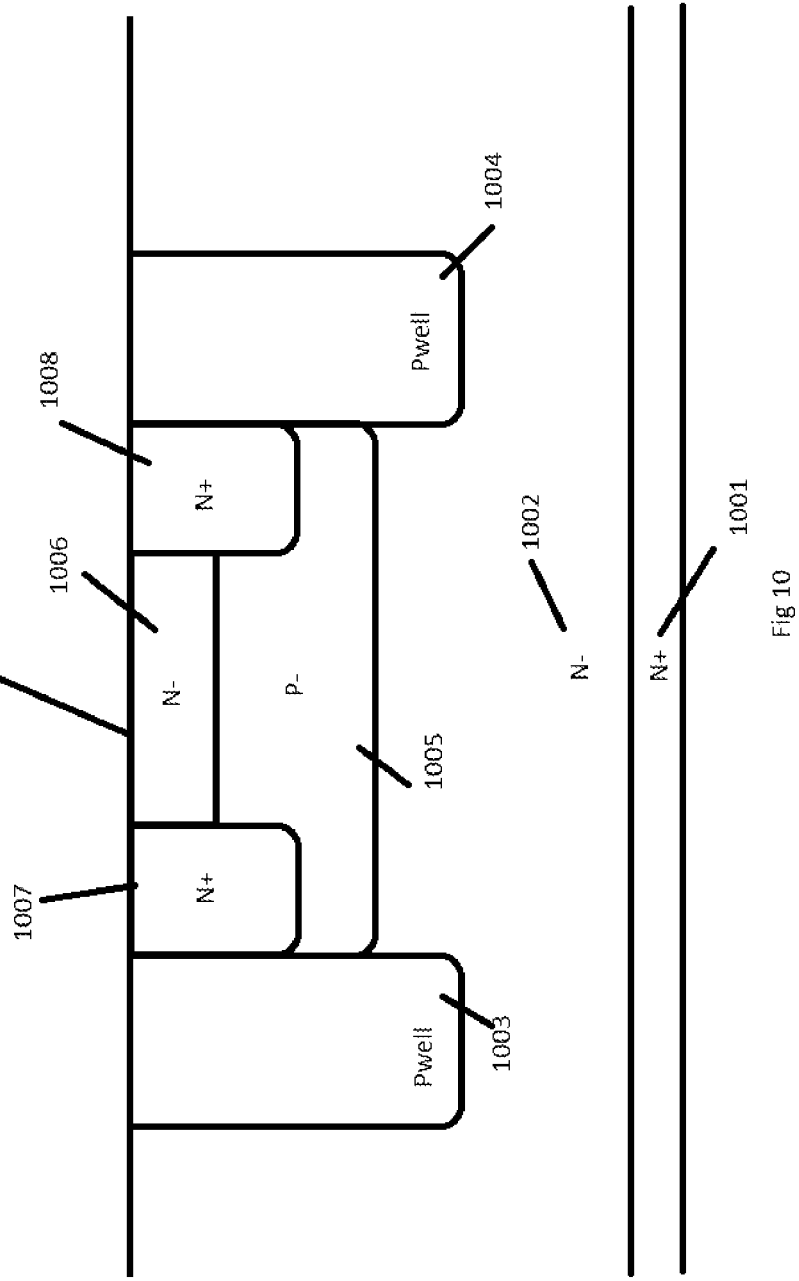
FIG. 10 illustrates another possible cross section for the structure of the diode connected bipolar device up to the forming of the base region.

Since the wells for the collector of the diode connected bipolar device as well as the base region of the Darlington device are of relatively high doping concentration, the process control for forming a lightly doped inversed region inside the diode connected bipolar device's collector well is very tight. To alleviate the tight processing control requirements, FIG. 10 illustrates a cross section of device structure up to the forming the base region of the diode connected bipolar device. Further structures to complete the cross section (for either normal bipolar or Schottky bipolar) are similar to those shown in FIG. 8 and FIG. 9. In FIG. 10, the collector region 1005 for the diode connected bipolar is having much lower dopant concentration as compared with P well region 1003 and 1004 that shield off region 1005 from high voltage. Hence, a lightly doped base region 1006 can be fabricated without tight processing control. P well 1003 together with 1004, and the high voltage collector region 1002 will have pinch off below region 1005 during the time when region 1001 is at high voltage. This ensures breakdown will not occur at region 1005. Such diode connected bipolar structures can be used to replace the equivalent parts in FIG. 8 and FIG. 9.

Figure 11:
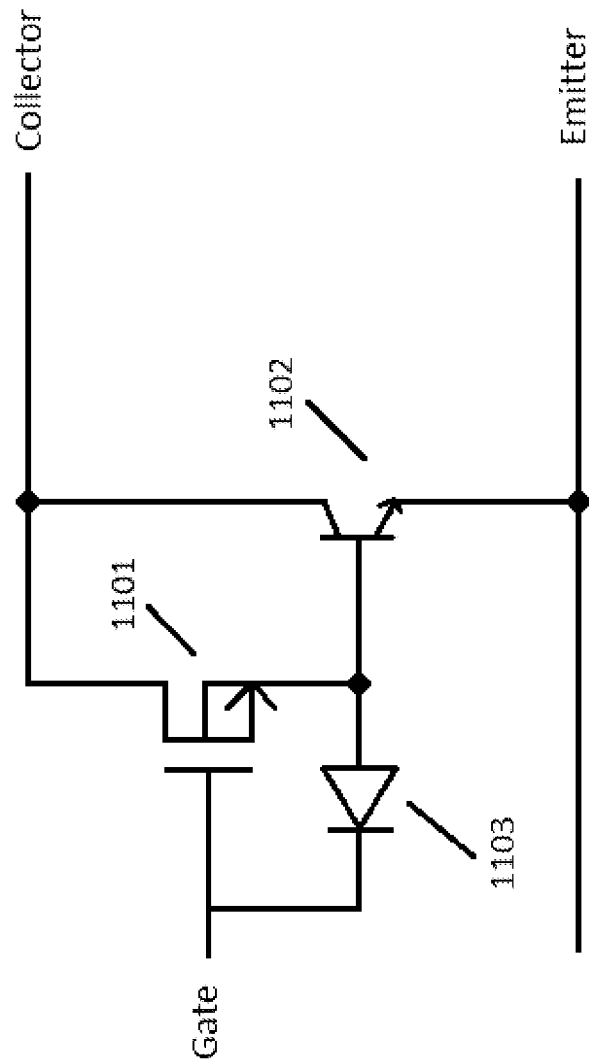
FIG. 11 is a schematic circuit diagram for the invented three pin high voltage hybrid MOSFET/bipolar power switching device with fast turn off time.

FIG. 11 is the circuit diagram for an embodiment of the invented three pin high voltage hybrid MOSFET/bipolar power switching device with fast turn off time. Basically, this is the replacing of the first bipolar transistor of the circuit in FIG. 4 by a MOSFET such that the circuit is IGBT in nature. Similar to diode 403, diode 1103 provides the base relaxation path during the turn off of the power switching device to ensure fast switching off time. Again, a Schottky diode is preferred while a normal diode can function.

Figure 12:
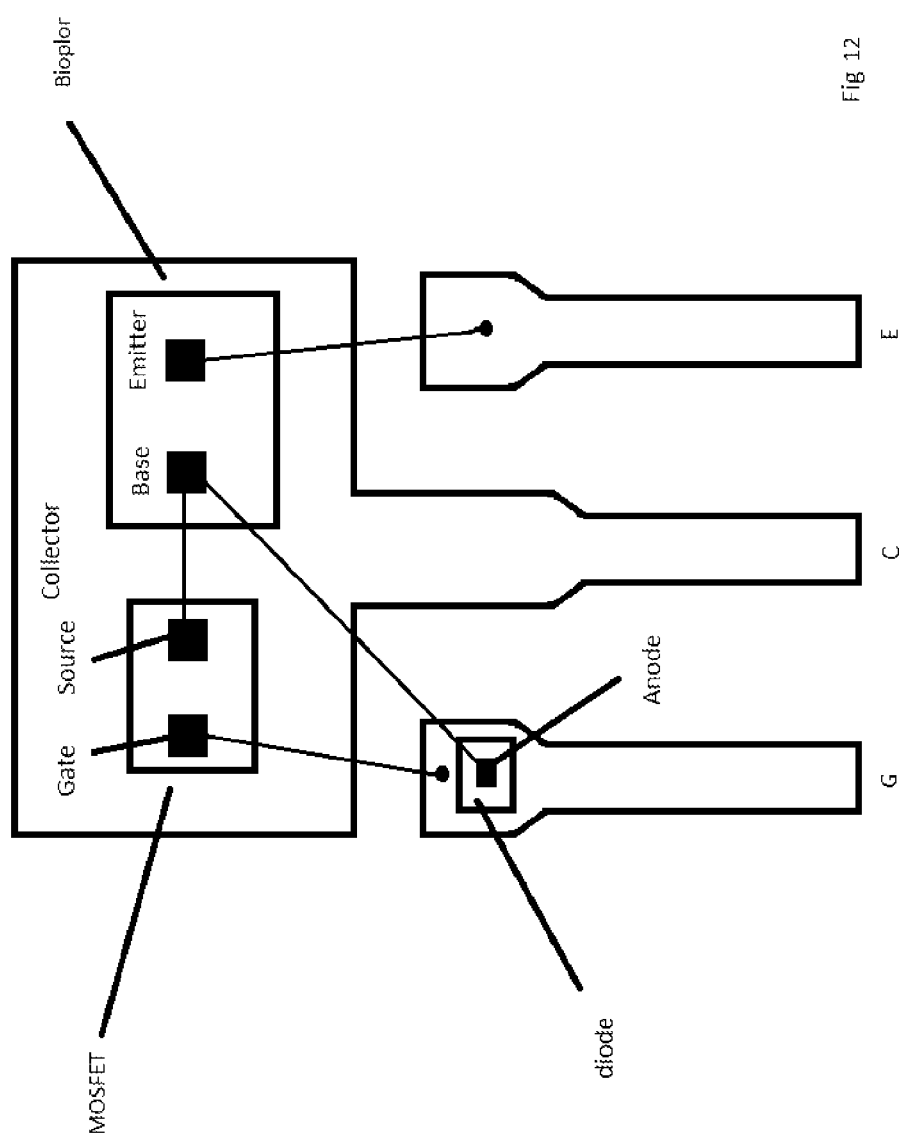
FIG. 12 illustrates a possible bonding diagram to integrate discrete devices forming the invented high voltage hybrid/bipolar power switching device into a single three pin package.

The three discrete semiconductor chips forming the invented high voltage hybrid MOSFET/bipolar power switching device can be packaged into a single three pin IC. MOSFET and bipolar transistor used are having the backside substrate as the drain and collector terminals respectively while other terminals are at the front side with bonding pads. Diode having cathode as substrate and anode pad at front side is used. The MOSFET and the bipolar transistor are die attached to the main die pad using conductive die attach epoxy. The main die pad and the collector pin of the package are electrically connected. The diode is conductive die attached to the base pin. Appropriate bonding connects the three individual discrete semiconductor chips into the circuit as shown in FIG. 11. Further steps such as plastic moulding, etc., to complete the packaging are then carried out to complete the three pin packaging. FIG. 12 illustrates the bonding diagram for inter-connecting the discrete devices into a single three pin package.

The three discrete devices forming the invented high voltage hybrid MOSFET/bipolar power switching device can be fabricated as a monolithic integrated circuit (IC). Use of high voltage SOI process is an obvious embodiment. Other possible embodiments are discussed in subsequent paragraphs.

The major difficulty in integrating the three discrete devices forming the invented high voltage hybrid MOSFET/bipolar power switching device into a monolithic IC using high voltage planer, super-junction, or semi-super-junction processes is the isolation of the diode from the substrate. A simple diode using a base well as anode and the emitter electrode inside the base well as cathode will not function due to the turn on of the vertical high voltage bipolar transistor having the substrate acting as the collector in the same way as for the vertical high voltage bipolar transistor. Similar to the high voltage Darlington power switching device, a diode connected bipolar is used to provide means to avoid the turn on of the parasitic transistor in the diode region.

Figure 13:
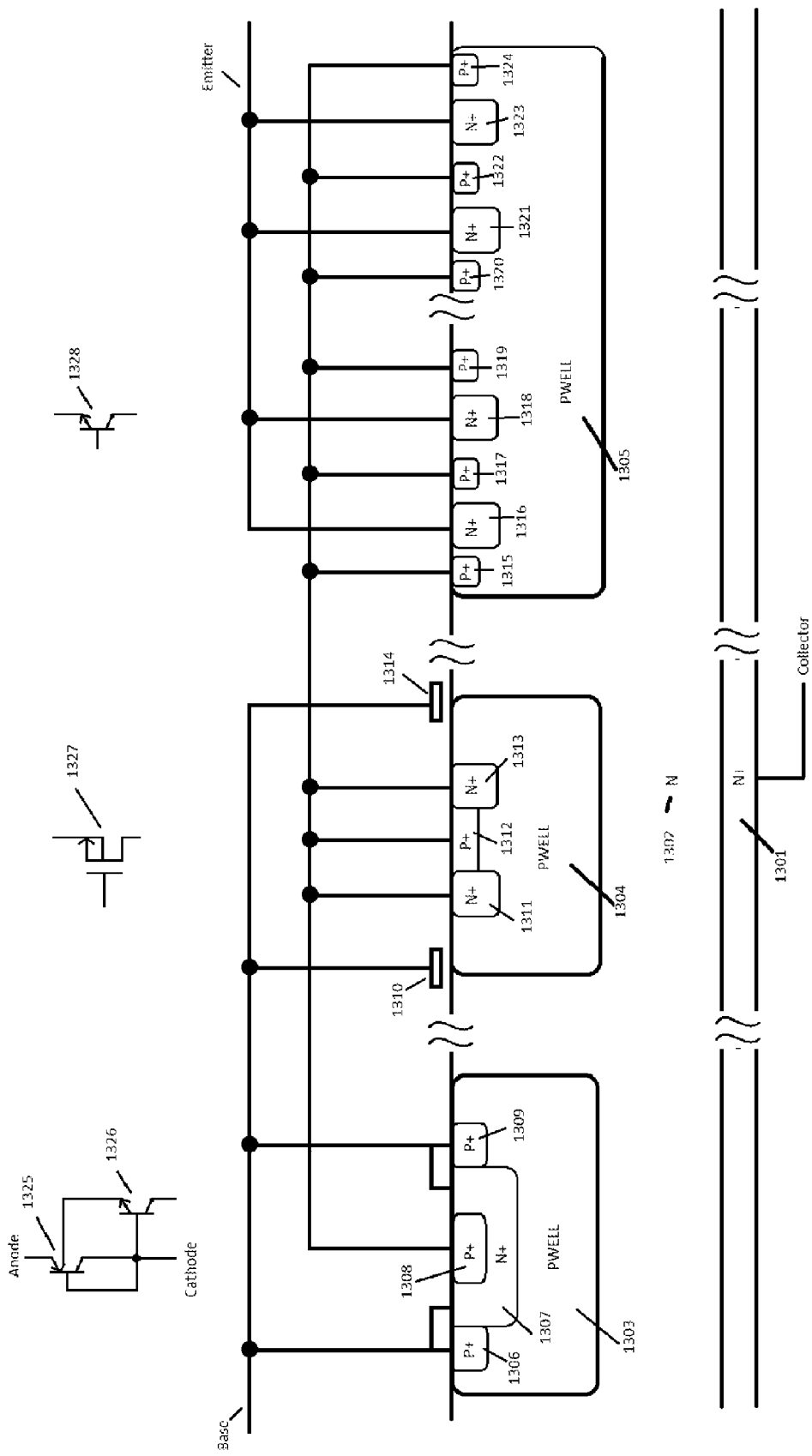
FIG. 13 illustrates a possible cross section of the invented high voltage hybrid MOSFET/bipolar switching device as a monolithic IC using modified high voltage planer VDMOS process.

FIG. 13 illustrates a possible cross section of a monolithic device integrating the three devices, namely a high voltage MOSFET, a high voltage bipolar transistor, and a diode, to form the invented high voltage hybrid MOSFET/bipolar switching device using high voltage planer process. The N− substrate 1302 serves as the drain and collector for the high voltage MOSFET 1327 and the high voltage bipolar transistor 1328 respectively. It is connected to the collector terminal of the switching device via the N+ backside 1301. P well 1305 serves as the base region while N+ electrodes 1316, 1318, 1321, and 1323 serve as the emitter electrodes for high voltage bipolar transistor 1328. P+ electrodes 1315, 1317, 1319, 1320, 1322, and 1324 are optional electrodes for making metal contact to the base region 1305 of the high voltage bipolar transistor. P well 1304 serves as the body region while N+ electrodes 1311 and 1313 serve as the source electrode, and the poly silicon 1310 and 1314 having thin oxide over channel region and thick oxide over field region serve as gate electrodes for the high voltage MOSFET 1327. P+ electrode 1312 is the optional electrode for making metal contact to the body region 1304 of the high voltage MOSFET 1327. P well 1303 is the collector for the diode connected bipolar 1325. N+ electrode 1307 is the base electrode inside P well 1303 while P+ electrode 1308 serves as the emitter electrode inside base region 1307. Emitter 1308 serves as the anode of the diode while base 1307 and collector 1303 are connected together by metal serve as the cathode of the diode. The main substrate 1302, P well 1303 and N+ electrode 1307 form a parasitic bipolar 1326 at the location while where the diode connected bipolar 1325 is located. Since the base emitter junction (1303 and 1307) of device 1326 is metal connected as required by the diode connected bipolar 1325, the turn on of the parasitic bipolar 1326 is prevented. The source and body of the high voltage MOSFET 1327 is connected to the base of the high voltage bipolar transistor 1328, as well as to the anode of the diode connected bipolar 1325. The gate of the high voltage MOSFET 1327 is connected to the cathode of the diode connected bipolar 1325, and is also serving as the gate terminal of the switching device. The emitter terminal of the high voltage bipolar transistor 1328 serves as the emitter terminal of the switching device. P+ electrodes 1306, 1309, 1312, 1315, 1317, 1319, 1320, 1322, and 1324 are optional connecting electrodes for making metal contact to the P well 1303, 1304, and 1305. Optionally, instead of connecting the body of the high voltage MOSFET to its own source electrode, it is also possible to connect the body to the emitter of the high voltage bipolar 1328, although the former connection is preferred. If the body of the high voltage MOSFET 1327 is connected to its own source, since it is electrically having the same potential as the base of the high voltage bipolar transistor 1328, P well 1304 and P well 1305 can then be merged as a single well to save chip area.

Figure 14:
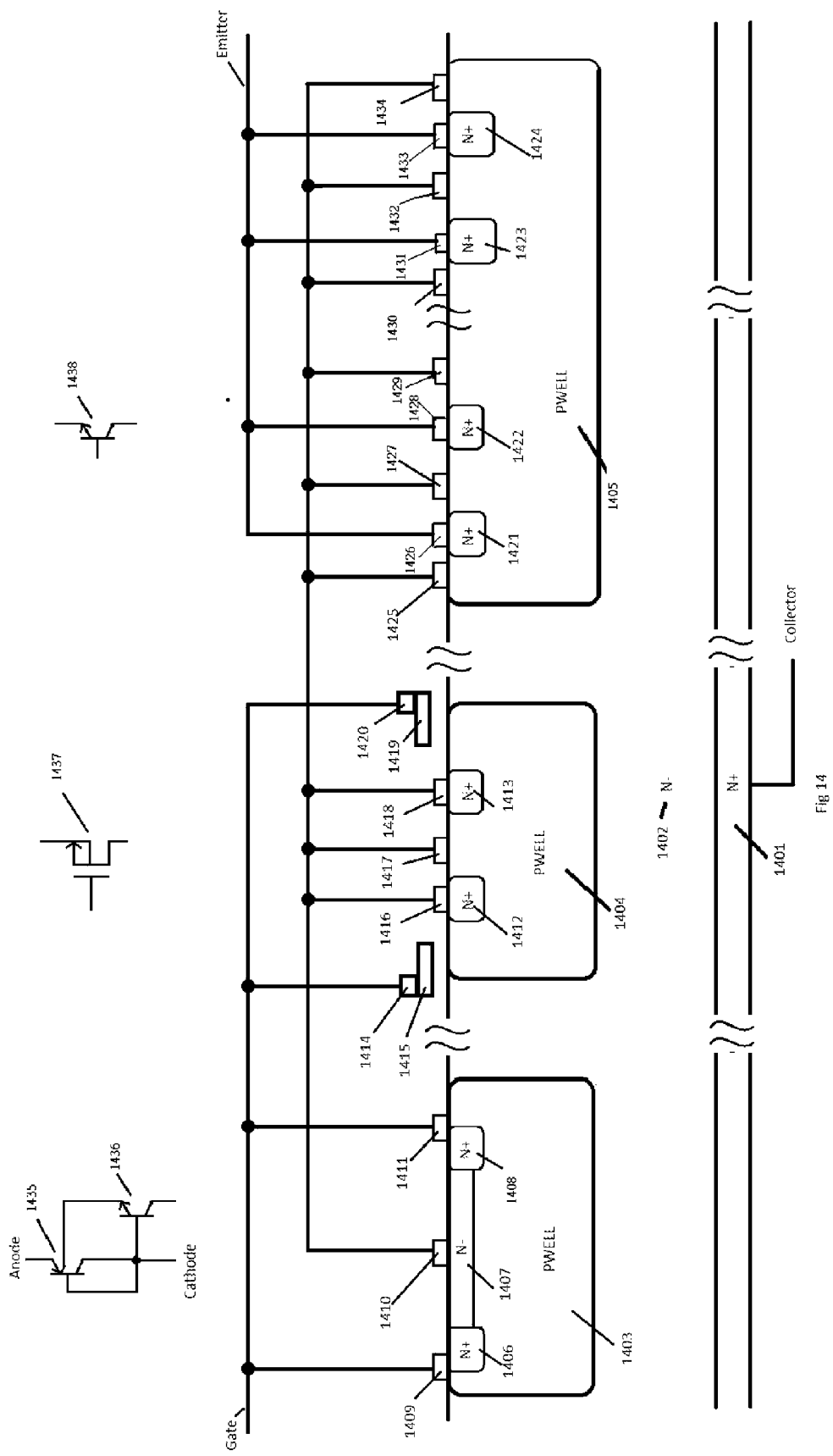
FIG. 14 illustrates another possible cross section of the invented high voltage hybrid MOSFET/bipolar switching device as a monolithic IC using modified high voltage planer VDMOS process.

FIG. 14 illustrates another possible cross section of a monolithic device integrating the three devices, namely a high voltage MOSFET, a high voltage bipolar transistor, and a diode, to form the invented high voltage hybrid MOSFET/bipolar switching device by high voltage planer process. The substrate 1402 serves as the drain and collector for the high voltage MOSFET 1437 and the high voltage bipolar transistor 1438 respectively. It is connected to the collector terminal of the switching device via the N+ backside 1401. P well 1405 serves as the base region while N+ electrodes 1421, 1422, 1423, and 1424 serve as the emitter electrodes for high voltage bipolar transistor 1438. P well 1404 serves as the body region while N+ electrodes 1412 and 1413 serve as the source electrodes, and the poly-silicon electrodes 1415 and 1419 having thin oxide over channel region and thick oxide over field region serve as gate electrodes for the high voltage MOSFET 1437. P well 1403 is the collector for the diode connected bipolar 1435. N− electrode 1407 is the base electrode inside P well 1403 while the barrier metal silicide electrode 1410 serves as the emitter electrode inside base region 1407 (N− electrode 1407 and barrier metal silicide 1410 form the Schottky base emitter junction). Connection to the base region 1407 is made via N+ electrodes 1406 and 1408. Emitter 1410 serves as the anode of the diode while base 1407 and collector 1403 are connected together serve as the cathode of the diode. Barrier metal silicide electrodes 1409, 1411, 1414, 1416, 1417, 1418, 1420, 1425, 1426, 1427, 1428, 1429, 1430, 1431, 1432, 1433, and 1434 are preferred optional electrodes for making metal contacts to the semiconductor electrodes other than the emitter electrode of the diode connected bipolar 1435. Direct metal connections to these electrodes are possible but the former case is preferred due to the possibility to share the same masking step for metal with the barrier metal silicide. The main N− substrate 1402, P well 1403 and N− electrode 1407 form a parasitic bipolar 1436 at the location while where the diode connected bipolar 1435 is located. Since the base emitter junction (1403 and 1407) of device 1436 is shorted as required by the diode connected bipolar 1435, the turn on of the parasitic bipolar 1436 is prevented. The source and body of the high voltage MOSFET 1437 is connected to base of the high voltage bipolar transistor 1438, as well as to the anode of the diode connected bipolar 1435. The gate of the high voltage MOSFET 1437 is connected to the cathode of the diode connected bipolar 1435, and is also serving as the gate terminal of the switching device. The emitter terminal of the high voltage bipolar transistor 1438 serves as the emitter terminal of the switching device. Optionally, instead of connecting the body of the high voltage MOSFET 1437 to its own source electrode, it is also possible to connect the body to the emitter of the high voltage bipolar 1438, although the former connection is preferred. If the body of the high voltage MOSFET 1437 is connected to its own source, since it is electrically having the same potential as the base of the high voltage bipolar transistor 1438, P well 1404 and P well 1305 can then be merged as a single well to save chip area.

Figure 15:
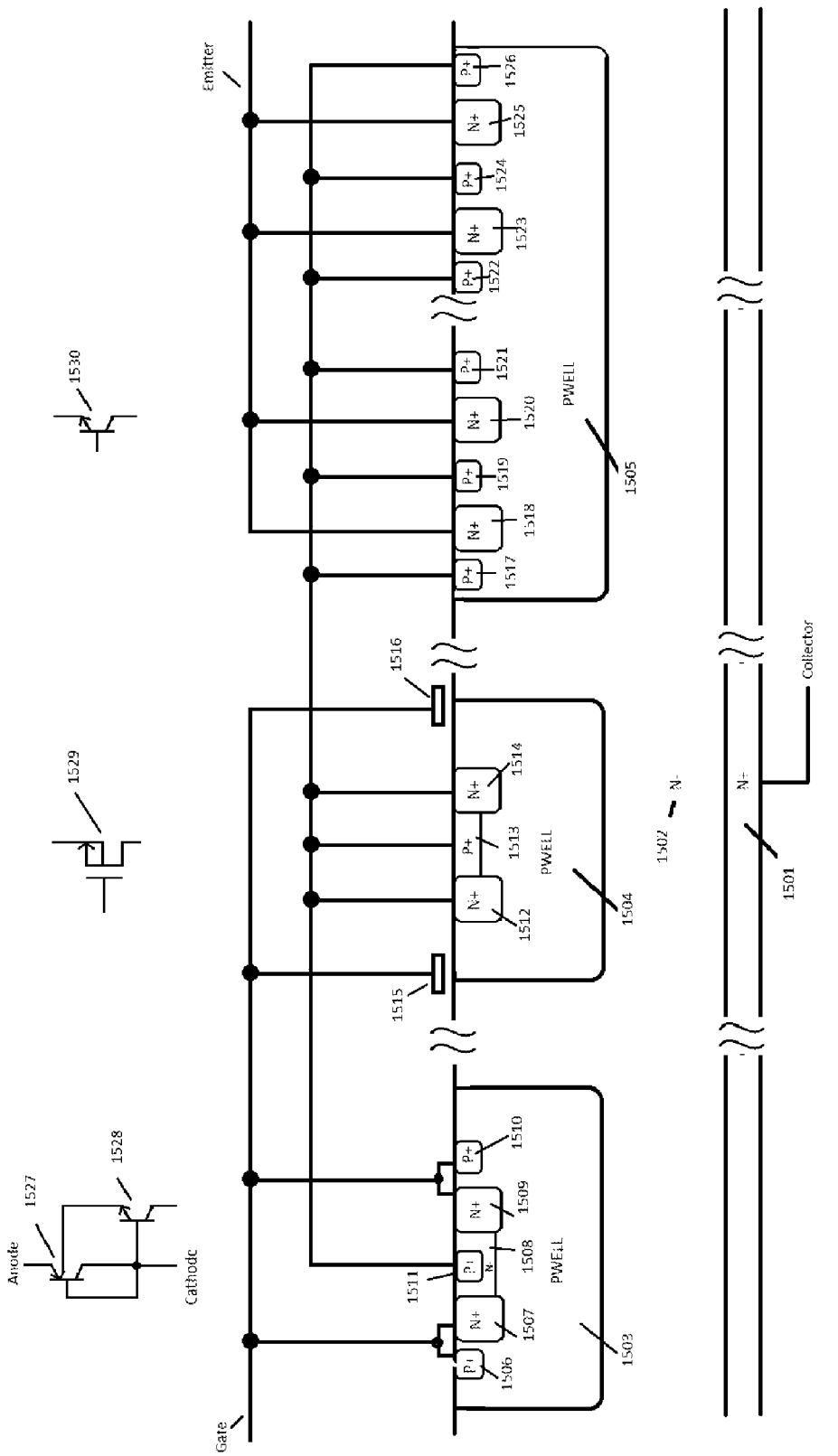
FIG. 15 illustrates a third possible cross section of the invented high voltage hybrid MOSFET/bipolar switching device as a monolithic IC using modified high voltage planer VDMOS process.

FIG. 15 illustrates another possible cross section of a monolithic device integrating the three devices, namely a high voltage MOSFET, a high voltage bipolar transistor, and a diode, to form the invented high voltage hybrid MOSFET/bipolar switching device by high voltage planer process. The substrate 1502 serves as the drain and collector for the high voltage MOSFET 1529 and the high voltage bipolar transistor 1530 respectively. It is connected to the collector terminal of the switching device via the N+ backside 1501. P well 1505 serves as the base region while N+ electrodes 1518, 1520, 1523, and 1525 serve as the emitter electrodes for high voltage bipolar transistor 1530. P well 1504 serves as the body region while N+ electrodes 1512 and 1514 serve as the source electrodes, and the poly-silicon electrodes 1515 and 1516 having thin oxide over channel region and thick oxide over field region serve as gate electrodes for the high voltage MOSFET 1529. P well 1503 is the collector for the diode connected bipolar 1527. N− electrode 1508 is the base electrode inside P well 1503 while the P+ electrode 1511 serves as the emitter electrode inside base region 1508. Connection to the base region 1508 is made via N+ electrodes 1507 and 1509. Emitter 1511 serves as the anode of the diode while base 1508 and collector 1503 are connected together serve as the cathode of the diode. P+ electrodes 1506, 1510, 1513, 1517, 1519, 1521, 1522, 1524, and 1526 are optional electrodes for making metal contacts to P wells 1503, 1504 and 1505 while direct metal connections to these P wells is possible. The main N− substrate 1502, P well 1503 and N− electrode 1508 form a parasitic bipolar 1528 at the location where the diode connected bipolar 1527 is located. Since the base emitter junction (1503 and 1508) of device 1527 is metal connected as required by the diode connected bipolar 1527, the turn on of the parasitic bipolar 1528 is prevented. The source and body of the high voltage MOSFET 1529 is connected to base of the high voltage bipolar transistor 1530, as well as to the anode of the diode connected bipolar 1527. The gate of the high voltage MOSFET 1529 is connected to the cathode of the diode connected bipolar 1527, and is also serving as the gate terminal of the switching device. The emitter terminal of the high voltage bipolar transistor 1530 serves as the emitter terminal of the switching device. Optionally, instead of connecting the body of the high voltage MOSFET 1529 to its own source electrode, it is also possible to connect the body of the high voltage MOSFET 1529 to the emitter of the high voltage bipolar 1530, although the former connection is preferred. If the body of the high voltage MOSFET 1529 is connected to its own source, since it is electrically having the same potential as the base of the high voltage bipolar transistor 1530, P well 1504 and P well 1505 can then be merged as a single well to save chip area.

Since the wells for the collector of the diode connected bipolar device, the body of the high voltage MOSFET and the base region of the high voltage bipolar transistor are of relatively high doping concentration, the process control for forming a lightly doped inversed region inside the diode connected bipolar device's collector well is very tight. The way to alleviate this problem is illustrated in FIG. 10 and had been discussed. Further structures to complete the cross section (for either normal bipolar or Schottky bipolar) are similar to those shown in FIG. 14 and FIG. 15. Such diode connected bipolar structures can be used to replace the equivalent parts in FIG. 14 and FIG. 15.

Figure 16:
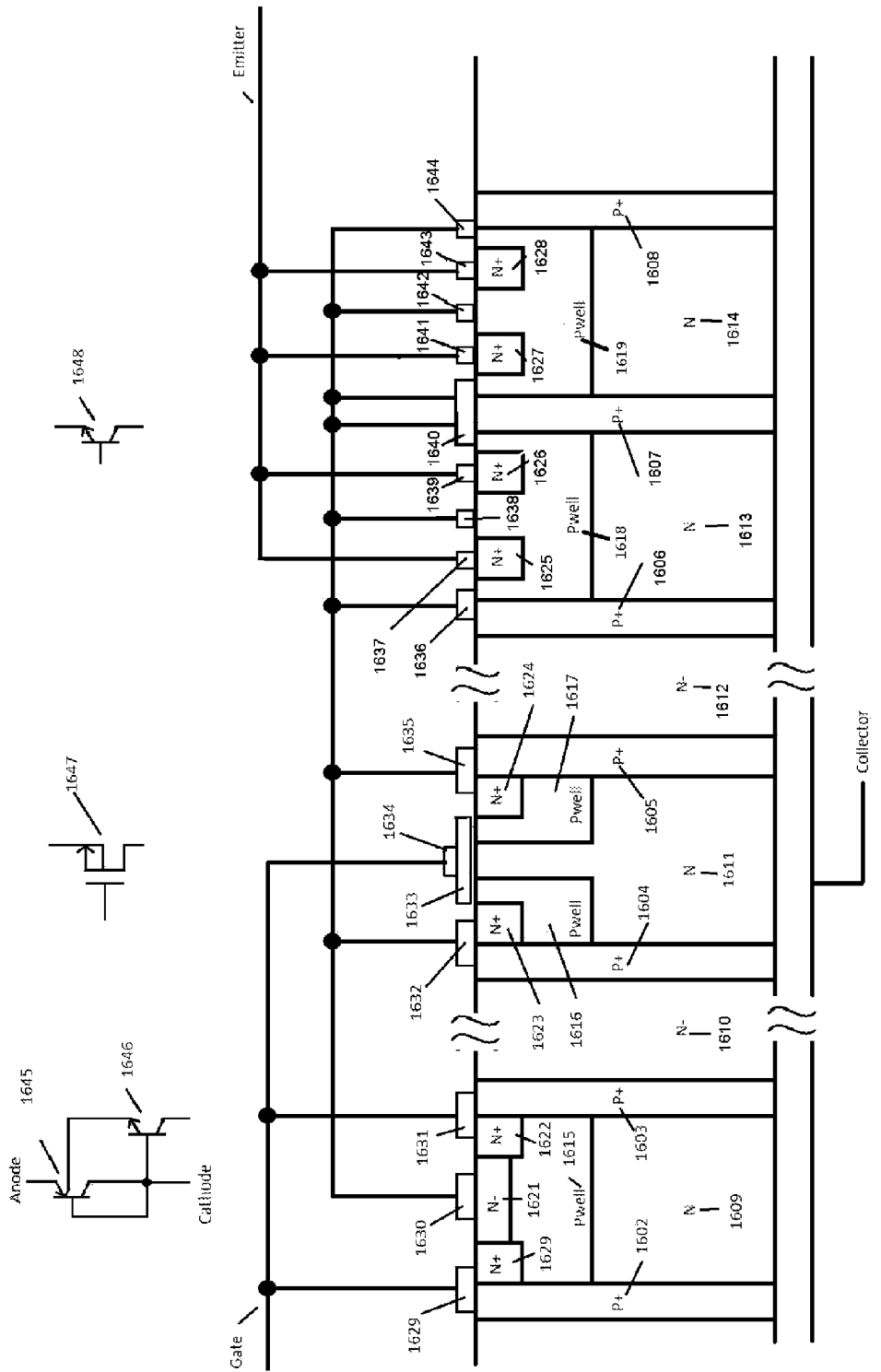
FIG. 16 illustrates a possible cross section of the invented high voltage hybrid MOSFET/bipolar switching device as a monolithic IC using modified high voltage super-junction VDMOS process.

FIG. 16 illustrates another possible cross section of a monolithic device integrating the three devices, namely a high voltage MOSFET, a high voltage bipolar transistor, and a diode, to form the invented high voltage hybrid MOSFET/bipolar switching device by high voltage super-junction process. The N− substrate 1611 serves as the drain for the high voltage MOSFET 1647 while N− substrate regions 1613 and 1614 serve as the collector of the high voltage bipolar transistor 1648. These N− regions are connected to the collector terminal of the switching device via the N+ backside 1601. Super-junction P+ columns 1602, 1603, 1604, 1605, 1606, 1607 and 1608 are used together with N− substrate regions 1609, 1610, 1611, 1612, 1613 and 1614 to withstand the high breakdown voltage. P wells 1618 and 1619 serve as the base region while N+ electrodes 1625, 1626, 1627, and 1628 serve as the emitter electrodes for high voltage bipolar transistor 1648. P wells 1616 and 1617 serve as the body regions while N+ electrodes 1623 and 1624 serve as the source electrodes, and the poly-silicon electrode 1633 having thin oxide over channel region and thick oxide over field region serve as gate electrode for the high voltage MOSFET 1647. P well 1615 is the collector for the diode connected bipolar 1645. N− electrode 1621 is the base electrode inside P well 1615 while the barrier metal silicide electrode 1630 serves as the emitter electrode inside base region 1621 (N− well 1621 and barrier metal silicide 1630 form a Schottky base emitter junction). Connection to the base region 1621 is made via N+ electrodes 1620 and 1622. Emitter 1630 serves as the anode of the diode while base 1621 and collector 1615 are connected together serve as the cathode of the diode. Barrier metal silicide electrodes 1629, 1631, 1632, 1634, 1635, 1636, 1637, 1638, 1639, 1640, 1641, 1642, 1643, and 1644 are preferred optional barrier metal silicide electrodes for making metal contacts to the semiconductor electrodes other than the emitter electrode of the diode connected bipolar 1645. Direct metal connections to these electrodes are possible but the former case is preferred due to the possibility to share the same masking step for metal with the barrier metal silicide. The N− substrate 1609, P well 1615 and N− electrode 1621 form a parasitic bipolar 1646 at the location where the diode connected bipolar 1645 is located. Since the base emitter junction (1615 and 1621) of device 1646 is shorted as required by the diode connected bipolar 1645, the turn on of the parasitic bipolar 1646 is prevented.

The source and body of the high voltage MOSFET 1647 are connected to base of the high voltage bipolar transistor 1648, as well as to the anode of the diode connected bipolar 1645. The gate of the high voltage MOSFET 1647 is connected to the cathode of the diode connected bipolar 1645, and is also serving as the gate terminal of the switching device. The emitter electrodes of the high voltage bipolar transistor 1648 serve as the emitter terminal of the switching device. Optionally, instead of connecting the body of the high voltage MOSFET 1647 to its own source electrode, it is also possible to connect the body to the emitter of the high voltage bipolar 1648, although the former connection is preferred. If the body of the high voltage MOSFET 1647 is connected to its own source, since it is electrically having the same potential as the base of the high voltage bipolar transistor 1648, P wells 1617, 1618 and 1619 can then be merged as a single well to save chip area. Hence, super-junction columns 1605 and 1606 can be merged to eliminate the N− region 1612 for isolation purpose between them.

Figure 17:
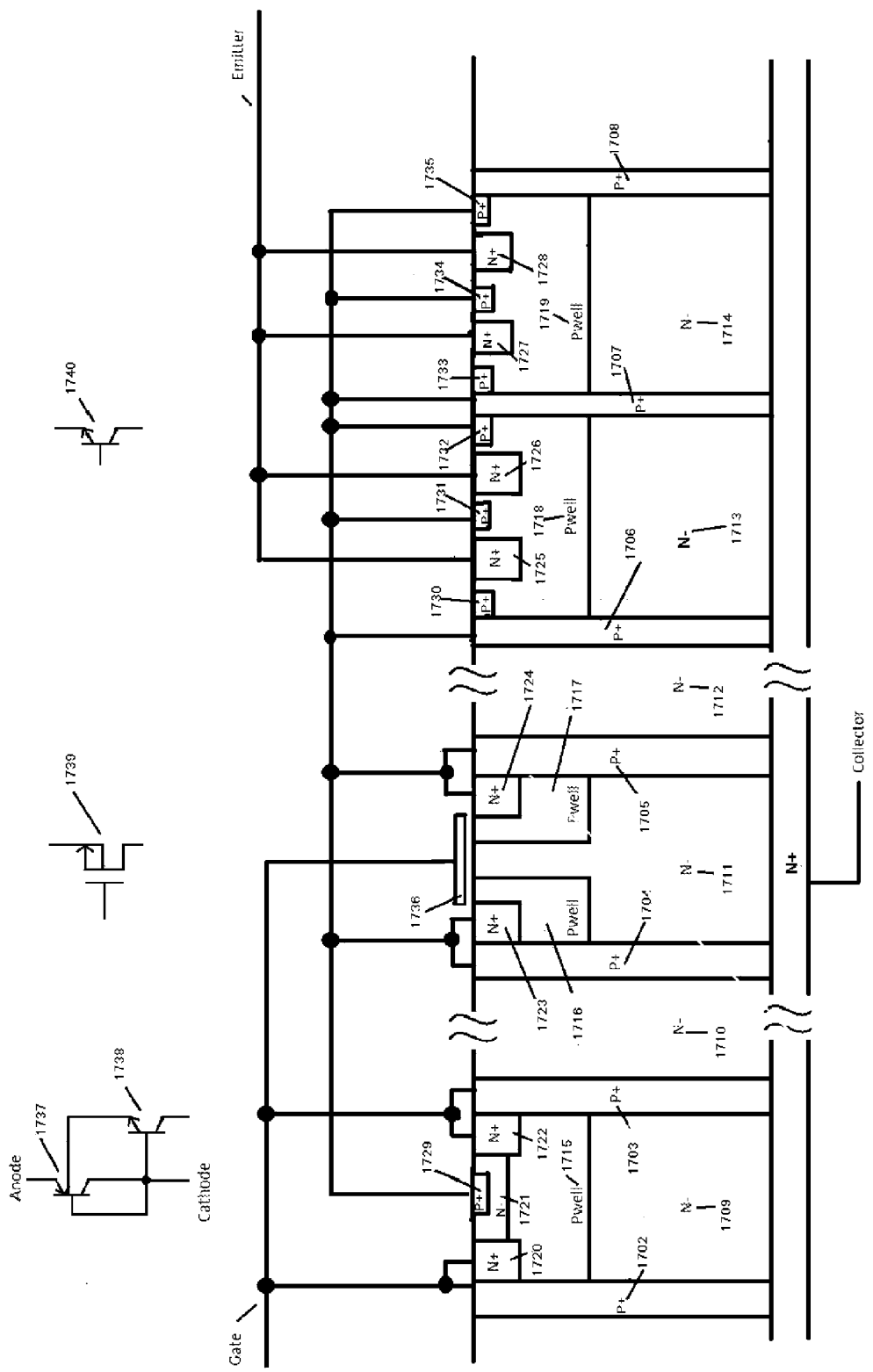
FIG. 17 illustrates another possible cross section of the invented high voltage hybrid MOSFET/bipolar switching device as a monolithic IC using modified high voltage super-junction VDMOS process.

FIG. 17 illustrates the cross section of another possible monolithic device integrating the 3 devices, namely a high voltage MOSFET, a high voltage bipolar transistor, and a diode, to form the invented high voltage hybrid MOSFET/bipolar switching device by high voltage super-junction process. The N− substrate 1711 serves as the drain for the high voltage MOSFET 1739. N− substrate regions 1713 and 1714 serve as base for the high voltage bipolar transistor 1740. These N− regions are connected to the collector terminal of the switching device via the N+ backside 1701. Super-junction P+ columns 1702, 1703, 1704, 1705, 1706, 1707 and 1708 are used together with N− substrate regions to withstand the high breakdown voltage. P wells 1718 and 1719 serve as the base region while N+ electrodes 1725, 1726, 1727, and 1728 serve as the emitter electrodes for high voltage bipolar transistor 1740. P wells 1716 and 1717 serve as the body regions while N+ electrodes 1723 and 1724 serve as the source electrodes, and the poly-silicon electrode 1736 having thin oxide over channel region and thick oxide over field region serves as gate electrode for the high voltage MOSFET 1739. P well 1715 is the collector for the diode connected bipolar 1737. N− electrode 1721 is the base electrode inside P well 1715 while the P+ electrode 1729 serves as the emitter electrode inside base region 1721. Connection to the base region 1721 is made via N+ electrodes 1720 and 1722. Emitter 1729 serves as the anode of the diode while base 1721 and collector 1715 are connected together to serve as the cathode of the diode. The N− substrate 1709, P well 1715 and N− electrode 1721 form a parasitic bipolar 1738 at the location where the diode connected bipolar 1737 is located. Since the base emitter junction (1715 and 1721) of device 1738 is metal connected as required by the diode connected bipolar 1737, the turn on of the parasitic bipolar 1738 is prevented. P+ electrodes 1730, 1731, 1732, 1733, 1734, and 1735 are optional electrodes for making metal contacts to P wells 1718 and 1719 while direct metal connections to these P wells is possible. The source and body of the high voltage MOSFET 1739 are connected to base of the high voltage bipolar transistor 1740, as well as to the anode of the diode connected bipolar 1737. The gate of the high voltage MOSFET 1739 is connected to the cathode of the diode connected bipolar 1737, and is also serving as the gate terminal of the switching device. The emitter electrodes of the high voltage bipolar transistor 1740 serve as the emitter terminal of the switching device. Optionally, instead of connecting the body of the high voltage MOSFET 1739 to its own source electrode, it is also possible to connect the body of the high voltage MOSFET 1739 to the emitter of the high voltage bipolar 1740, although the former connection is preferred. If the body of the high voltage MOSFET 1739 is connected to its own source, since it is electrically having the same potential as the base of the high voltage bipolar transistor 1740, P wells 1717, 1718 and 1719 can then be merged as a single well to save chip area. Hence, super-junction columns 1705 and 1706 can be merged to eliminate the N− region 1712 for isolation purpose between them.

Since the wells for the collector of the diode connected bipolar device, the body of the high voltage MOSFET and the base region of the high voltage bipolar transistor are of relatively high doping concentration, the process control for forming a lightly doped inversed region inside the diode connected bipolar device's collector well is very tight. The way to alleviate this problem is illustrated in FIG. 10 and had been discussed. Further structures to complete the cross section (for either normal bipolar or Schottky bipolar) are similar to those shown in FIG. 16 and FIG. 17. Such diode connected bipolar structures can be used to replace the equivalent parts in FIG. 16 and FIG. 17.

Figure 18:
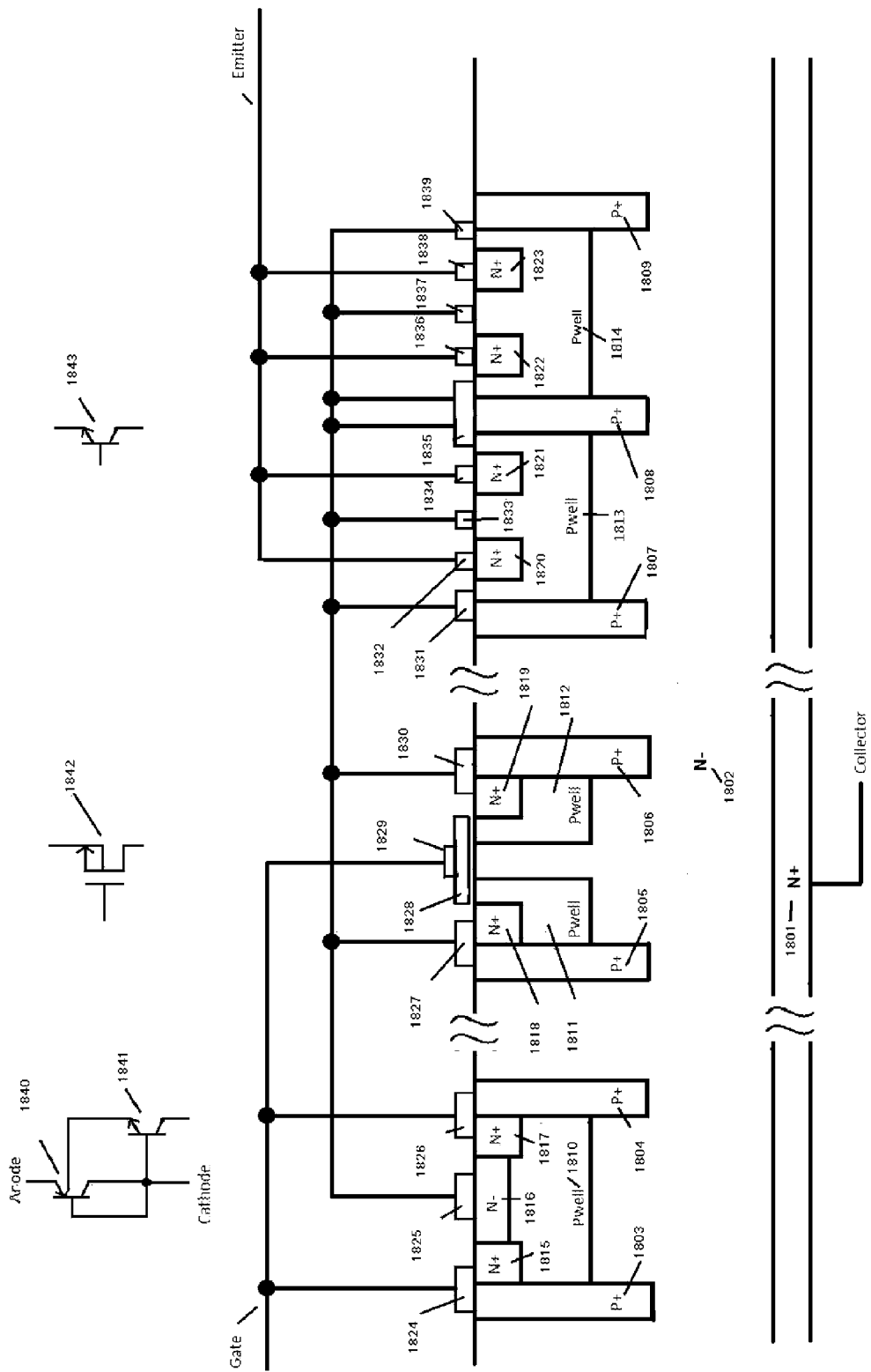
FIG. 18 illustrates a possible cross section of the invented high voltage hybrid MOSFET/bipolar switching device as a monolithic IC using modified high voltage semi-super-junction VDMOS process.

FIG. 18 illustrates another possible cross section of a monolithic device integrating the three devices, namely a high voltage MOSFET, a high voltage bipolar transistor, and a diode, to form the invented high voltage hybrid MOSFET/bipolar switching device by high voltage semi-super-junction process. The N− substrate 1802 serves as the drain for the high voltage MOSFET 1842 and the collector for the high voltage bipolar transistor 1843. The N− substrate 1802 is connected to the collector terminal of the switching device via the N+ backside 1801. Semi-super-junction P+ columns 1803, 1804, 1805, 1806, 1807, 1808 and 1809 are used together with N− substrate 1802 to withstand the high breakdown voltage. P wells 1813 and 1814 serve as the base regions while N+ electrodes 1820, 1821, 1822, and 1823 serve as the emitter electrodes for high voltage bipolar transistor 1843. P wells 1811 and 1812 serve as the body regions while N+ electrodes 1818 and 1819 serve as the source electrodes, and the poly-silicon electrode 1828 having thin oxide over channel region and thick oxide over field region serve as gate electrode for the high voltage MOSFET 1842. P well 1810 is the collector for the diode connected bipolar 1840. N− electrode 1816 is the base electrode inside P well 1810 while the barrier metal silicide electrode 1825 serves as the emitter electrode inside base region 1816 (N− well 1816 and barrier metal silicide 1825 form a Schottky base emitter junction). Connection to the base region 1816 is made via N+ electrodes 1815 and 1817. Emitter 1825 serves as the anode of the diode while base 1816 and collector 1810 are connected together serve as the cathode of the diode. Barrier metal silicide electrodes 1824, 1826, 1827, 1829, 1830, 1831, 1832, 1833, 1834, 1835, 1836, 1837, 1838, and 1839 are preferred optional barrier metal silicide electrodes for making metal contacts to the semiconductor electrodes other than the emitter electrode of the diode connected bipolar 1840. Direct metal connections to these electrodes are possible but the former case is preferred due to the possibility to share the same masking step for metal with the barrier metal silicide. The N− substrate 1802, P well 1810 and N− electrode 1816 form a parasitic bipolar 1841 at the location where the diode connected bipolar 1840 is located. Since the base emitter junction (1810 and 1816) of device 1841 is shorted as required by the diode connected bipolar 1840, the turn on of the parasitic bipolar 1841 is prevented. The source and body of the high voltage MOSFET 1842 are connected to base of the high voltage bipolar transistor 1843, as well as to the anode of the diode connected bipolar 1840. The gate of the high voltage MOSFET 1842 is connected to the cathode of the diode connected bipolar 1840, and is also serving as the gate terminal of the switching device. The emitter electrodes of the high voltage bipolar transistor 1843 serve as the emitter terminal of the switching device. Optionally, instead of connecting the body of the high voltage MOSFET 1842 to its own source electrode, it is also possible to connect the body to the emitter of the high voltage bipolar 1843, although the former connection is preferred. If the body of the high voltage MOSFET 1842 is connected to its own source, since it is electrically having the same potential as the base of the high voltage bipolar transistor 1843, P wells 1812, 1813 and 1814 can then be merged as a single well to save chip area. Hence, super-junction columns 1806 and 1807 can be merged to eliminate the N− region for isolation purpose between them.

Figure 19:
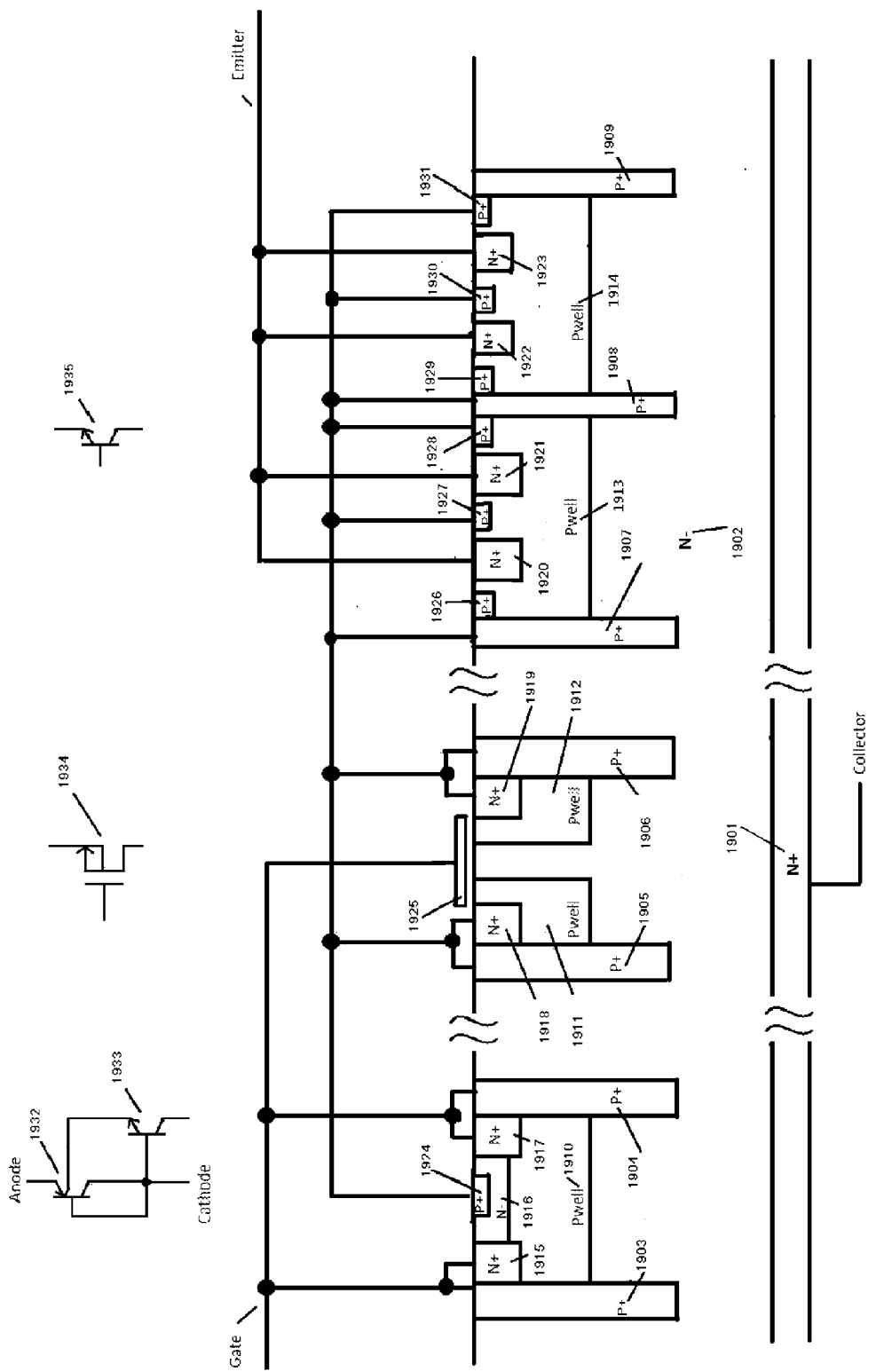
FIG. 19 illustrates another possible cross section of the invented high voltage hybrid MOSFET/bipolar switching device as a monolithic IC using modified high voltage semi-super-junction VDMOS process.

FIG. 19 illustrates the cross section of another possible monolithic device integrating the 3 devices, namely a high voltage MOSFET, a high voltage bipolar transistor, and a diode, to form the invented high voltage hybrid MOSFET/bipolar switching device by high voltage semi-super-junction process. The N− substrate 1902 serves as the drain for the high voltage MOSFET 1934 and the collector for the high voltage bipolar transistor 1935. The N− substrate 1902 is connected to the collector terminal of the switching device via the N+ backside 1901. Semi-super-junction P+ columns 1903, 1904, 1905, 1906, 1907, 1908 and 1909 are used together with N− substrate 1902 to withstand the high breakdown voltage.

P wells 1913 and 1914 serve as the base regions while N+ electrodes 1920, 1921, 1922, and 1923 serve as the emitter electrodes for high voltage bipolar transistor 1935. P wells 1911 and 1912 serve as the body regions while N+ electrodes 1918 and 1919 serve as the source electrodes, and the poly-silicon electrode 1925 having thin oxide over channel region and thick oxide over field region serves as gate electrode for the high voltage MOSFET 1934. P well 1910 is the collector for the diode connected bipolar 1932. N− electrode 1916 is the base electrode inside P well 1910 while the P+ electrode 1924 serves as the emitter electrode inside base region 1916. Connection to the base region 1916 is made via N+ electrodes 1915 and 1917. Emitter 1924 serves as the anode of the diode while base 1916 and collector 1910 are connected together to serve as the cathode of the diode. The N− substrate 1902, P well 1910 and N− electrode 1916 form a parasitic bipolar 1933 at the location where the diode connected bipolar 1932 is located. Since the base emitter junction (1910 and 1916) of device 1933 is metal connected as required by the diode connected bipolar 1932, the turn on of the parasitic bipolar 1933 is prevented. P+ electrodes 1926, 1927, 1928, 1929, 1930, and 1931 are optional electrodes for making metal contacts to P wells 1913 and 1914 while direct metal connections to these P wells is possible. The source and body of the high voltage MOSFET 1934 are connected to base of the high voltage bipolar transistor 1935, as well as to the anode of the diode connected bipolar 1932. The gate of the high voltage MOSFET 1934 is connected to the cathode of the diode connected bipolar 1932, and is also serving as the gate terminal of the switching device.

The emitter electrodes of the high voltage bipolar transistor 1935 serve as the emitter terminal of the switching device. Optionally, instead of connecting the body of the high voltage MOSFET 1934 to its own source electrode, it is also possible to connect the body of the high voltage MOSFET 1934 to the emitter of the high voltage bipolar 1935, although the former connection is preferred. If the body of the high voltage MOSFET 1934 is connected to its own source, since it is electrically having the same potential as the base of the high voltage bipolar transistor 1935, P wells 1912, 1913 and 1914 can then be merged as a single well to save chip area. Hence, semi-super-junction columns 1906 and 1907 can be merged to eliminate the N− region between them.

Since the wells for the collector of the diode connected bipolar device, the body of the high voltage MOSFET and the base region of the high voltage bipolar transistor are of relatively high doping concentration, the process control for forming a lightly doped inversed region inside the diode connected bipolar device's collector well is very tight. The way to alleviate this problem is illustrated in FIG. 10 and had been discussed. Further structures to complete the cross section (for either normal bipolar or Schottky bipolar) are similar to those shown in FIG. 18 and FIG. 19. Such diode connected bipolar structures can be used to replace the equivalent parts in FIG. 18 and FIG. 19.

The invention claimed is:

1. A method of fabricating a three terminal high voltage hybrid MOSFET/bipolar transistor power switching device having a collector terminal, a gate bonding terminal with a gate bonding pin and an emitter with an emitter pin, including the steps of:
   conductive die attaching a high voltage MOSFET and a high voltage bipolar transistor having a substrate as a drain and a collector terminal respectively, to a main die pad of a three terminal power device, which serves as the collector terminal for the power switching device;
   conductive die attaching a diode having a cathode and an anode with the cathode as a substrate to the gate bonding pin of the gate terminal of the three terminal power device;
   bonding a gate of the high voltage MOSFET to the gate terminal of the three terminal power device package;
   inter-chip bonding of a source of the high voltage MOSFET to a base of the high voltage bipolar transistor;
   bonding of the source of the high voltage MOSFET and/or a base of the high voltage bipolar transistor to the anode of the diode;
   bonding of an emitter of the high voltage bipolar transistor to the emitter pin of the three pin power; and
   subsequent standard moulding and follow on process to complete the device.

2. The method of claim 1, wherein the diode is a Schottky diode.

* * * * *